(12) United States Patent
Uchiyama

(10) Patent No.: US 8,102,287 B2
(45) Date of Patent: Jan. 24, 2012

(54) COMPRESSION/DECOMPRESSION APPARATUS AND COMPRESSION/DECOMPRESSION METHOD

(75) Inventor: Masato Uchiyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/721,008

(22) Filed: Mar. 10, 2010

(65) Prior Publication Data

US 2011/0018745 A1 Jan. 27, 2011

(30) Foreign Application Priority Data

Jul. 23, 2009 (JP) .................. 2009-172057

(51) Int. Cl.
*H03M 7/34* (2006.01)
(52) U.S. Cl. .............. 341/51; 341/50; 341/106
(58) Field of Classification Search ......... 341/50, 341/51, 60, 106
See application file for complete search history.

(56) References Cited

U.S. PATENT DOCUMENTS

| 5,729,228 | A  * | 3/1998  | Franaszek et al. ........ 341/106 |
| 6,300,887 | B1 * | 10/2001 | Le .................... 341/60 |
| 6,816,093 | B1 * | 11/2004 | Jaquette .................. 341/51 |
| 6,959,110 | B1 * | 10/2005 | Danskin et al. ............ 382/166 |
| 7,290,063 | B2 * | 10/2007 | Kalliokulju et al. .......... 709/247 |
| 7,447,814 | B1 * | 11/2008 | Ekman .................. 710/68 |
| 2002/0018010 | A1 * | 2/2002 | Le ..................... 341/60 |
| 2002/0091905 | A1 * | 7/2002 | Geiger et al. ............. 711/170 |
| 2003/0028673 | A1 * | 2/2003 | Lin et al. ................ 709/247 |
| 2006/0023955 | A1 * | 2/2006 | Namera et al. ............ 382/232 |

FOREIGN PATENT DOCUMENTS

| JP | 2003189109 | 7/2003 |
| JP | 2006067247 | 3/2006 |
| JP | 2008252163 | 10/2008 |

* cited by examiner

*Primary Examiner* — Jean Jeanglaude
(74) *Attorney, Agent, or Firm* — Turocy & Watson, LLP

(57) ABSTRACT

In a compression/decompression apparatus that compresses or decompresses a plurality of sub-block data elements, a compressing unit compresses the plurality of sub-block data elements in parallel by a plurality of compressors. A combining unit combines compressed data by the plurality of compressors to generate a transfer data such that the transfer data has a transfer data amount corresponding to a plurality of transferring cycles, each transfer data amount per one transferring cycle is divided into a plurality of segmented regions in same number as number of the sub-block data elements, and allocating each compressed data of the plurality of sub-block data elements is allocated to a corresponding segmented region of the plurality of segmented regions, and outputs the transfer data to the external memory. A decompressing unit decompresses the transfer data read from the external memory in parallel by using a plurality of decompressors. An arranging unit performs address conversion.

18 Claims, 18 Drawing Sheets

| | | |
|---|---|---|
| SELECTION SIGNAL S10a | CYCLE 1 | OUTPUT TO BUS ={A0, B0, C0, D0} |
| | CYCLE 2 | OUTPUT TO BUS ={A0, B0, C0, D0} |
| | CYCLE 3 | OUTPUT TO BUS ={A0, B0, C0, D0} |
| | CYCLE 4 | OUTPUT TO BUS ={A0, B0, C0, D0} |
| SELECTION SIGNAL S10b | CYCLE 1 | OUTPUT TO BUS ={A0, A1, B0, B1} //OUTPUTS OF BUFFERS C AND D ARE NOT UPDATED IN THIS CYCLE |
| | CYCLE 2 | OUTPUT TO BUS ={C0, C1, D0, D1} //OUTPUTS OF ALL BUFFERS ARE UPDATED FROM HERE |
| | CYCLE 3 | OUTPUT TO BUS ={A0, A1, B0, B1} |
| | CYCLE 4 | OUTPUT TO BUS ={C0, C1, D0, D1} |

| | CYCLE 1 | {A0, B0, C0, D0}= OUTPUT FROM BUS |
|---|---|---|
| SELECTION SIGNAL S20a | CYCLE 2 | {A0, B0, C0, D0}= OUTPUT FROM BUS |
| | CYCLE 3 | {A0, B0, C0, D0}= OUTPUT FROM BUS |
| | CYCLE 4 | {A0, B0, C0, D0}= OUTPUT FROM BUS |
| SELECTION SIGNAL S20b | CYCLE 1 | {A0, A1, B0, B1}= OUTPUT FROM BUS |
| | CYCLE 2 | {C0, C1, D0, D1}= OUTPUT FROM BUS |
| | CYCLE 3 | {A0, A1, B0, B1}= OUTPUT FROM BUS |
| | CYCLE 4 | {C0, C1, D0, D1}= OUTPUT FROM BUS |

COMPRESSION/DECOMPRESSION APPARATUS AND COMPRESSION/DECOMPRESSION METHOD

CROSS-REFERENCE TO RELATED APPLICATIONS

This application is based upon and claims the benefit of priority from the prior Japanese Patent Application No. 2009-172057, filed on Jul. 23, 2009; the entire contents of which are incorporated herein by reference.

BACKGROUND OF THE INVENTION

1. Field of the Invention

The present invention relates to a compression/decompression apparatus and a compression/decompression method.

2. Description of the Related Art

The data amount handled by electronic devices has been increasing in recent years. Accompanying this trend, the data amount shifted to an external memory is also increasing. Therefore, conventionally, an apparatus configuration has been employed such that when data is shifted from a buffer in an apparatus to an external memory, the data is compressed and written in the external memory via a bus, and when data is shifted from the external memory to the buffer in the apparatus, compressed data read from the external memory via a bus is decompressed and then written in the internal buffer.

For example, in a case of image data, block-shaped image data is compressed or decompressed for each pixel having 8-bit size in an uncompressed state by using a compression/decompression algorithm for sequentially performing compression and decompression. When the requirement of data transfer speed between the internal buffer and the external memory cannot be satisfied with a throughput of one pixel per cycle, a configuration is employed such that a plurality of compression apparatuses and decompression apparatuses are provided to parallelize compression/decompression processing (see, for example, Japanese Patent Application Laid-open No. 2008-252163). Because the compression/decompression algorithm used in this case is an algorithm in a unit of block data, the entire block data to be transferred is divided into a plurality of sub-block data elements, and these elements are processed in parallel.

However, for example, when one block data is divided into four sub-block data elements, data elements after compression are arranged in order of compression, transferred to an external memory in this order, and read from the external memory in this order. As a result, when compressed data is read from the external memory and decompressed, decompression processing is directly started for sub-block data elements arranged at the head. However, sub-block data elements arranged subsequent thereto are read from the external memory after read of the first sub-block data elements is finished. Therefore, the decompression processing for the subsequent data elements is not started unless read of the first sub-block data elements is finished. Likewise, the decompression processing for third sub-block data elements is not started unless read of the first and second sub-block data elements is finished. Further, the decompression processing for fourth sub-block data elements is not started unless read of the first, second, and third sub-block data elements is finished.

Therefore, even when decompression apparatuses are provided in the same number as the number of sub-block data elements, there can be a state that some of the decompression apparatuses cannot start processing and have to wait until transfer of at least the third sub-block data elements is completed, and thus high level parallelism cannot be maintained. Accordingly, there is a problem that a large number of cycles are required for decompression processing of the entire block data.

Therefore, an object of the present invention is to provide a compression/decompression apparatus and a compression/decompression method, which are capable of reducing the number of cycles required for decompression processing of the entire block data.

BRIEF SUMMARY OF THE INVENTION

A compression/decompression apparatus that compresses or decompresses a plurality of sub-block data elements acquired by dividing block data for data communication with an external memory according to an embodiment of the present invention comprises:

a compressing unit that includes a plurality of compressors and compresses the sub-block data elements in parallel by using the compressors;

a combining unit that combines compressed data in respective segmented regions to generate transfer data, after dividing a transfer data amount per cycle and allocating compressed data in a predetermined amount of at least two sub-block data elements of the sub-block data elements compressed by the compressing unit to each segmented region, and outputs transfer data to the external memory;

a decompressing unit that includes a plurality of decompressors and decompresses compressed data of the transfer data read from the external memory and allocated to respective segmented regions in parallel by using the decompressors; and an arranging unit that performs address conversion so that respective elements of the data decompressed by the decompressing unit are arranged at original positions in the block data.

A compression/decompression method for compressing or decompressing a plurality of sub-block data elements acquired by dividing block data for data communication with an external memory according to an embodiment of the present invention comprises:

compressing the sub-block data elements in parallel;

combining compressed data in respective segmented regions to generate transfer data, after dividing a transfer data amount per cycle and allocating compressed data in a predetermined amount of at least two sub-block data elements of the compressed sub-block data elements to each segmented region, and outputting transfer data to the external memory;

decompressing compressed data of the transfer data read from the external memory and allocated to respective segmented regions in parallel; and arranging including performing address conversion so that respective elements of the decompressed data are arranged at original positions in the block data.

DETAILED DESCRIPTION OF THE INVENTION

Exemplary embodiments of a compression/decompression apparatus and a compression/decompression method according to the present invention will be explained below in detail with reference to the accompanying drawings. The present invention is not limited to the following embodiments.

Figure 1:
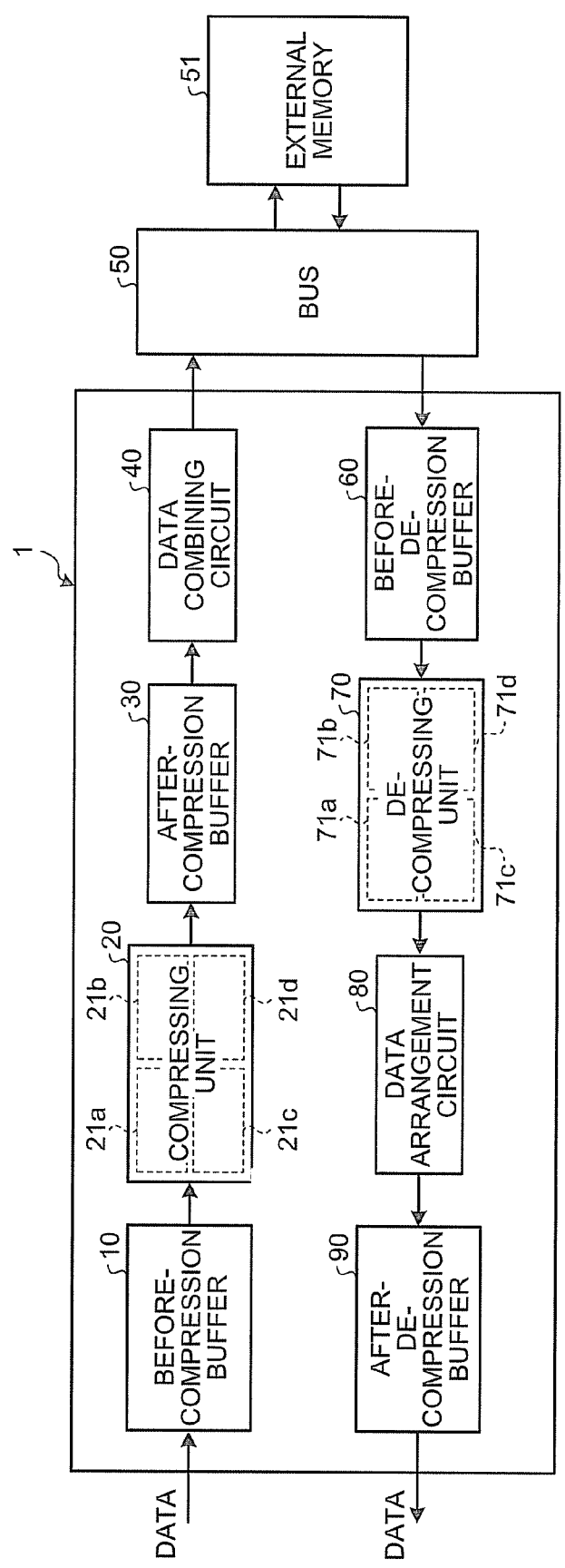
FIG. 1 is a block diagram of a configuration of a compression/decompression apparatus according to a first embodiment of the present invention.

FIG. 1 is a block diagram of a configuration of a compression/decompression apparatus according to a first embodiment of the present invention. As shown in FIG. 1, a compression/decompression apparatus 1 according to the first embodiment includes a before-compression buffer 10, a compressing unit 20, an after-compression buffer 30, and a data combining circuit 40, as a compression mechanism that compresses data to be transferred. After compression of input data, the compression/decompression apparatus 1 transfers compressed data to an external memory 51 via a bus 50, for example, by burst transfer. The compression/depression apparatus 1 further includes a before-decompression buffer 60, a decompressing unit 70, a data arrangement circuit 80, and an after-decompression buffer 90, to decompress and output the compressed data in the external memory 51 read via the bus 50. The first embodiment explains a case that processing is performed in a unit of 16×16 pixel blocks as a macroblock in image processing and block-shaped image data is compressed or decompressed for each pixel having 8-bit size in an uncompressed state by using the compression/decompression algorithm for sequentially performing compression and decompression.

Figure 2:
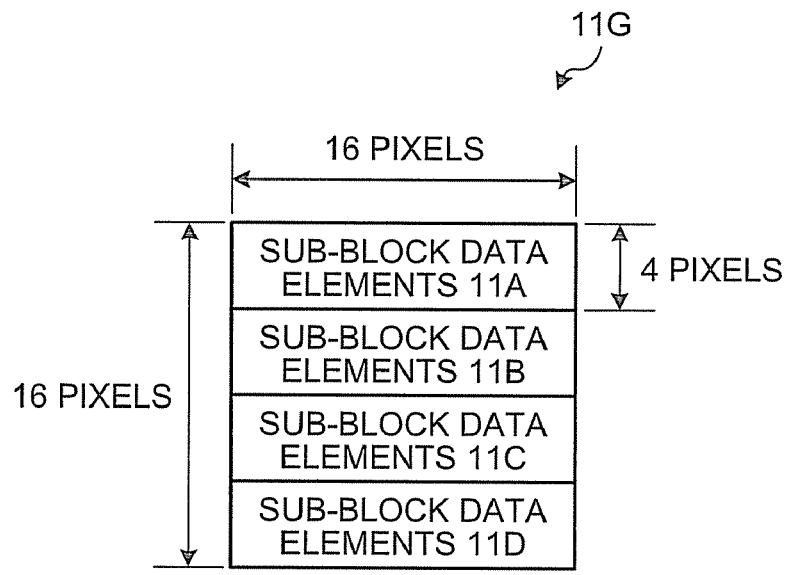
FIG. 2 is a schematic diagram for explaining image data before compression.
Figure 3:
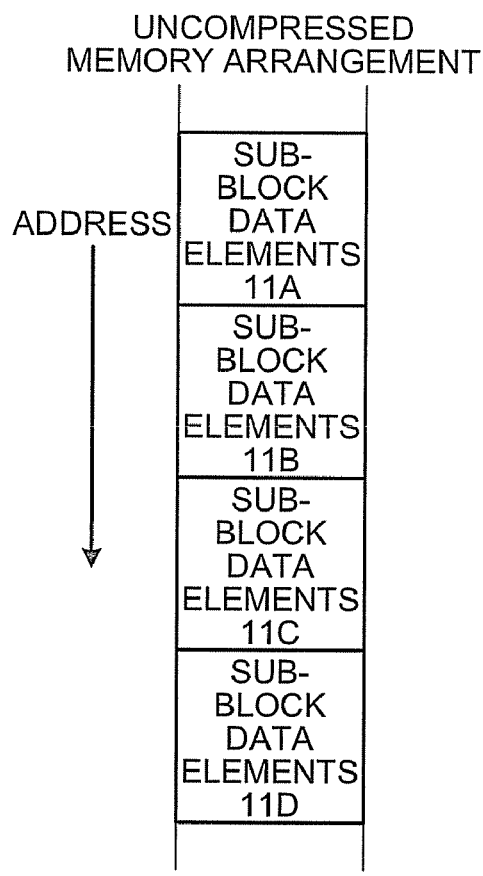
FIG. 3 is a schematic diagram for explaining a dividing method of image data before compression.

The before-compression buffer 10 temporarily stores pixel data to be compressed, and adjusts an input timing of data and a compression timing of the compressing unit 20. Block data 11G having a size of 16×16 pixels shown in FIG. 2 is sequentially stored in the before-compression buffer in a state of being divided into four sub-block data elements 11A to 11D having the size of 16×4 pixels as shown in FIG. 3. In the sub-block data elements 11A, a pixel 0 is arranged first, in the sub-block data elements 11B, a pixel 64 is arranged first, in the sub-block data elements 11C, a pixel 128 is arranged first, and in the sub-block data elements 11D, a pixel 192 is arranged first.

The compressing unit 20 includes a plurality of compressors 21a to 21d, and can compress respective elements of pixel data in a plurality of sub-block data elements in parallel by using the compressors 21a to 21d. The compressing unit 20 includes the compressors 21a to 21d in the same number as the number of the sub-block data elements 11A to 11D. The four compressors 21a to 21d read the sub-block data elements to be processed from the before-compression buffer 10, respectively, to compress the four sub-block data elements in parallel.

The after-compression buffer 30 temporarily stores the compressed data compressed by the respective compressors 21a to 21d, and adjusts the input timing of the compressed data by the respective compressors 21a to 21d and a processing timing in the data combining circuit 40.

The data combining circuit 40 divides a transfer data amount per cycle and allocates a predetermined amount of compressed data in two or more elements of sub-bock data of the sub-block data elements compressed by the compressors 21a to 21d to respective segmented regions. The data combining circuit 40 then combines the elements of compression data in the respective segmented regions to generate transfer data, and outputs the transfer data to the external memory 51. The data combining circuit 40 evenly divides the transfer data amount per cycle into the number equal to the number of the sub-block data elements and that of the decompressors, and allocates the same amount of compressed data of the sub-block data elements compressed by the compressors 21a to 21d to each segmented region.

The before-decompression buffer 60 temporarily stores data read from the external memory 51 via the bus 50, and adjusts a transfer timing of the bus 50 and a decompression timing in the decompressing unit 70.

The decompressing unit 70 includes a plurality of decompressors 71a to 71d, and can decompress a plurality of elements of transfer data in parallel by using the decompressors 71a to 71d. The decompressing unit 70 includes the decompressors 71a to 71d in the same number as the number of the sub-block data, elements 11A to 11D. The four decompressors 71a to 71d respectively read the transfer data to be processed from the before-decompression buffer 60, and decompress the four elements of transfer data in parallel. Because the transfer data includes the compressed sub-block data elements, the decompressors 71a to 71d output pixel data constituting the sub-block data elements 11a to 11D as the data after decompression.

The data arrangement circuit 80 performs address conversion so that respective data elements decompressed by the decompressors 71a to 71d are arranged at original positions in the block data. The data arrangement circuit 80 converts an address so that the pixel data respectively constituting the sub-block data elements 11A to 11D decompressed by the decompressors 71a to 71d are arranged at original positions in the block data 11G before compression, and writes the converted address in the after-decompression buffer 90.

The after-decompression buffer 90 temporarily stores the pixel data after decompression. The pixel data stored in the after-decompression buffer 90 is in a pixel arrangement before compression due to address conversion processing performed by the data arrangement circuit 80. As the compression/decompression algorithm in the compression/decompression apparatus 1, such an algorism is used that the number of bits after compression can be ensured in a unit of sub-block data and image quality of an image varies. The decompression processing is assumed to have a throughput of one pixel per cycle by one decompressor.

Transfer-data generation processing performed by the data combining circuit 40 for processing the compressed sub-block data elements to generate transfer data is explained next. Data arrangement of the data before compression is explained first. As shown in FIG. 3, after the block data 11G to be processed is divided into four sub-block data elements 11A to 11D, the four sub-block data elements 11A to 11D are arranged in order of sub-block data elements 11A in which data of the pixel 0 is arranged first, sub-block data elements 11B in which data of the pixel 64 is arranged first, sub-block data elements 11C in which data of the pixel 128 is arranged first, and sub-block data elements 11D in which data of the pixel 192 is arranged first. The respective sub-block data elements 11A to 11D are respectively read by the corresponding compressors 21a to 21d, stored in the after-compression buffer 30 after being compressed in parallel, and respectively read from the after-compression buffer 30 by the data combining circuit 40.

Figure 4:
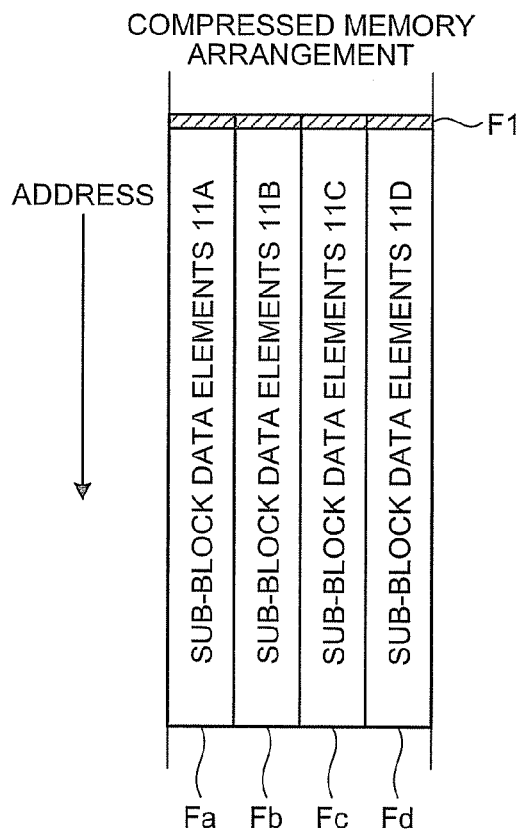
FIG. 4 is a schematic diagram for explaining transfer data generated by a data combining circuit shown in FIG. 1.

The data combining circuit 40 evenly divides the transfer data amount per cycle into four same as the number of sub-block data elements 11A to 11D, and arranges the data so that the same amount of compressed data of the sub-block data elements 11A to 11D compressed by the compressors 21a to 21d are allocated to the respective segmented regions. That is, as shown in FIG. 4, the data combining circuit 40 generates the respective elements of transfer data to include the same amount of the compressed data Fa to Fd of the sub-block data elements 11A to 11D. Accordingly, the first transfer data F1 includes the same amount of compressed data of all sub-block data elements 11A to 11D.

For example, when data in which one pixel includes 8 bits is compressed to ½, because the data amount before compression of the respective sub-block data elements is 16 (pixels)×4 (pixels)×16 (bits), that is, the data amount before compression is 512 bits, the data amount after compression of the respective sub-block data elements is 256 bits or less. When burst transfer for transferring data having 64 bits per cycle is used for data transfer on the bus 50, four bursts are required to transfer one element of sub-block data elements.

Figure 5:
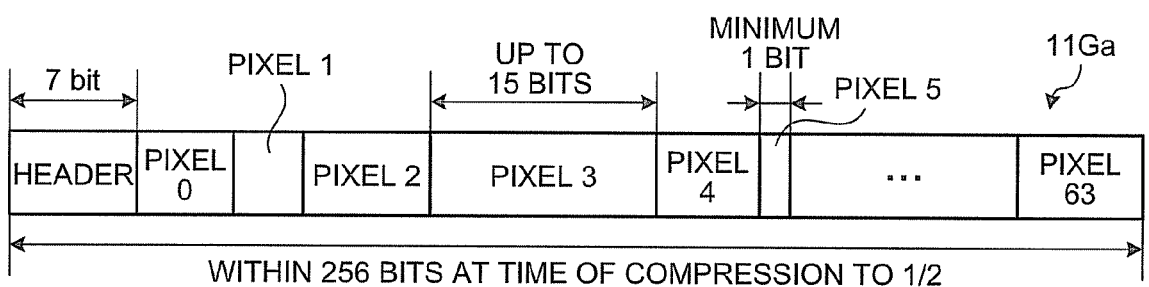
FIG. 5 is a schematic diagram for explaining image data after compression.

As shown in data 11Ga in FIG. 5, a data format after compression is such that there is one header for one element of sub-block data elements and compressed data for each pixel. A header for holding a compression coefficient has a fixed 7-bit length, and compressed data per pixel has a variable length of from 1 bit to 15 bits. When only one pixel is considered, the size thereof after compression can increase than that before compression. However, when the entire sub-block data is considered, the number of bits after compression is compressed to ensure a certain data compression ratio.

Figure 6:
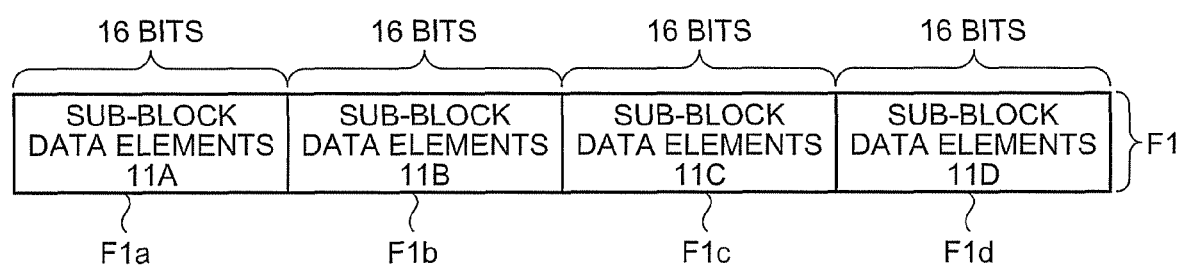
FIG. 6 is a schematic diagram for explaining the head of the transfer data shown in FIG. 4.

When burst transfer for transferring data having 64 bits per cycle is used for data transfer on the bus 50, the data combining circuit 40 divides 64 bits, which is the transfer data amount per cycle, into four segmented regions, which is the same number as the number of the sub-block data elements 11A to 11D, so that each segmented region has 16 bits. For example, as shown in FIG. 6, the 64-bit first transfer data F1 is divided into 16-bit segmented regions F1a to F1d.

The data combining circuit 40 arranges data so that elements of 16-bit compressed data of the sub-block data elements 11A to 11D respectively compressed by the compressors 21a to 21d are allocated to respective 16-bit segmented regions F1a to F1d.

Figure 7:
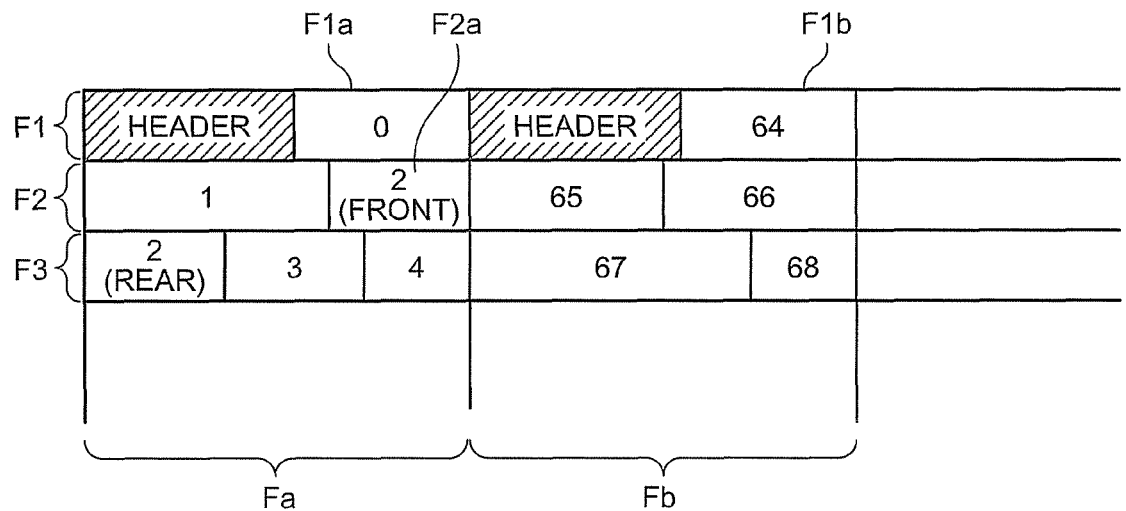
FIG. 7 is a schematic diagram for explaining the transfer data shown in FIG. 4.

When the compressed data of the pixel 0 in the sub-block data elements 11A has 9 bits to make it 16 bits in total by allocating the 7-bit header, as shown in FIG. 7, the data combining circuit 40 allocates the header of the sub-block data elements 11A and compressed data of the pixel 0 to the segmented region F1a corresponding to the sub-block data elements 11A of the first transfer data F1. When data of the pixel 64 in the sub-block data elements 11B has 9 bits, the data combining circuit 40 allocates the header of the sub-block data elements 11B and compressed data of the pixel 64 to the segmented region F1b corresponding to the sub-block data elements 11B of the first transfer data F1. Likewise, the data combining circuit 40 allocates the header of the sub-block data elements 11C and compressed data for 9 bits to the region F1c corresponding to the sub-block data elements 11C of the first transfer data F1, and then allocates the header of the sub-block data elements 11D and compressed data for 9 bits to the region F1d corresponding to the sub-block data elements 11D of the first transfer data F1. For the second transfer data F2, the data combining circuit 40 allocates compressed data of a pixel 1, which is the next pixel data of the pixel data allocated in the first transfer data F1 and compressed data of a pixel 2 to the segmented region F2a corresponding to the sub-block data elements 11A for 16 bits.

Furthermore, when the total bits of compressed data of a plurality of pixels allocated to the transfer data is larger than 16 bits, the data combining circuit 40 allocates pixel data of and after the 17th bit to the next transfer data. For example, when the total bits of compressed data of the pixel 1 and the pixel 2 in the sub-block data elements 11A exceeds 16 bits, the data combining circuit 40 allocates data 2 of the pixel 2 of and after the 17th bit to the third transfer data F3, as shown in FIG. 7.

Thus, the data combining circuit 40 evenly divides 64 bits, which is the transfer data amount per cycle, into four, and sequentially allocates 16-bit compressed data of the sub-block data elements 11A to 11D respectively corresponding to each 16-bit segmented region in order of pixels. As shown in FIG. 4, therefore, the data elements Fa to Fd after compression of the respective sub-block data elements 11A to 11D are included by 16 bits in all the transfer data elements.

Further, 64-bit transfer data to be read from the external memory 51 by the compression/decompression apparatus 1 includes 16-bit data after compression of the sub-block data elements 11A to 11D. The 64-bit transfer data is extracted by 16 bits at a time by the respective decompressors 71a to 71d.

Figure 8:
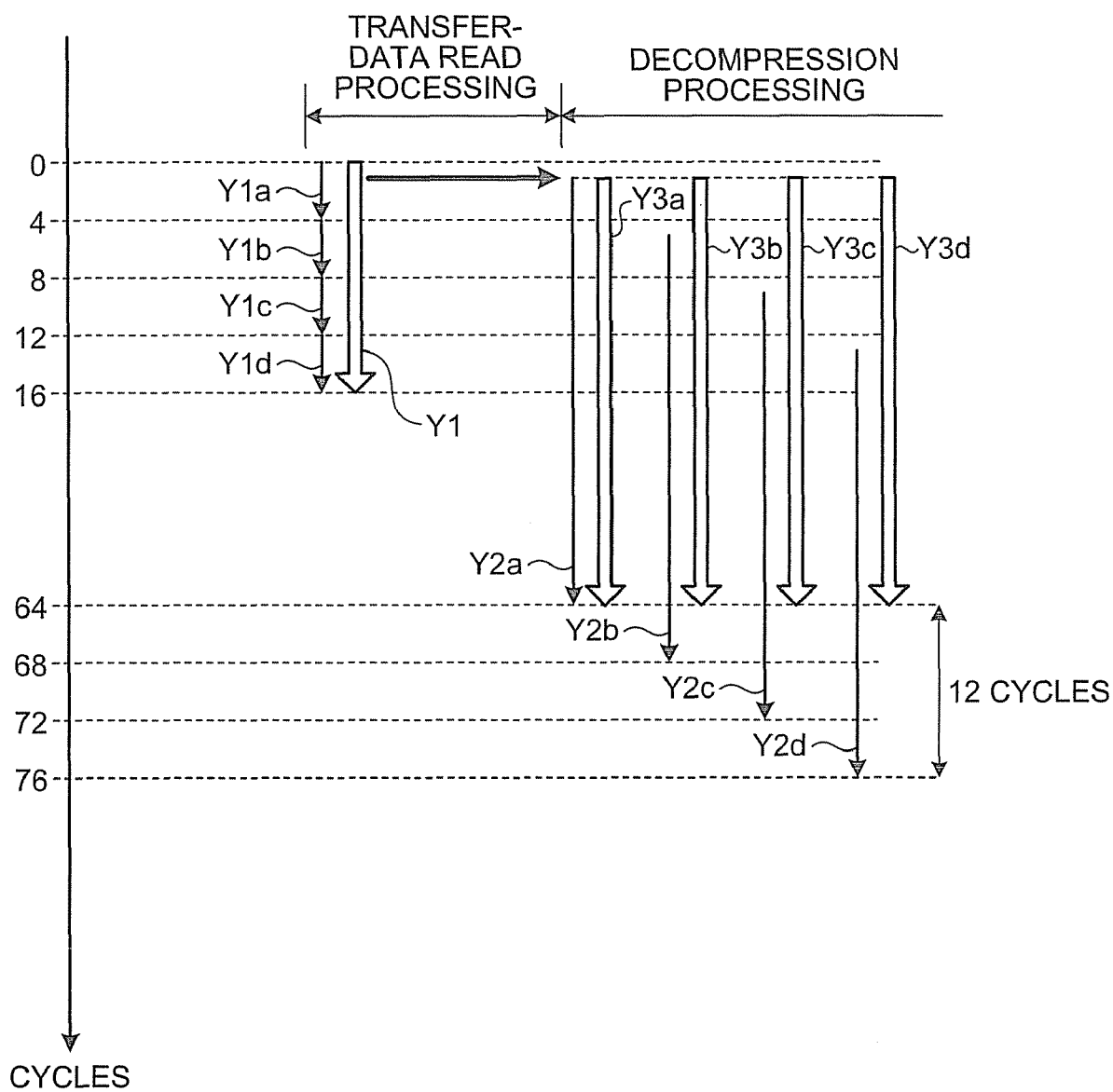
FIG. 8 is a schematic diagram for explaining cycles required for decompression processing in the first embodiment.

The decompressors 71a to 71d then decompress each 16-bit compressed data in parallel. When burst transfer is used, as shown in FIG. 8, the compression/decompression apparatus 1 requires 16 cycles as shown by an arrow Y1 in order to read all the compressed data corresponding to four sub-block data elements 11A to 11D from the external memory 51.

All the transfer data elements include 16-bit compressed data of the sub-block data elements 11A to 11D. Therefore, the first transfer data includes 16-bit compressed data of the respective sub-block data elements 11A to 11D. Accordingly, the four decompressors 71a to 71d respectively corresponding to the sub-block data elements 11A to 11D can acquire the compressed data of the sub-block data elements 11A to 11D by 16 bits at a time from the first transfer data. Therefore, as shown by arrows Y3a to Y3d in FIG. 8, the respective decompressors 71a to 71d can start the decompression processing without waiting with respect to the compressed data respectively corresponding to the sub-block data elements 11A to 11D included in the first transfer data, from the 0th cycle in which the first transfer data has arrived at the compression/decompression apparatus 1. The arrow Y3a shown in FIG. 8 indicates a decompression processing cycle of the decompressor 71a that performs decompression processing of the sub-block data elements 11A, an arrow Y3b indicates a decompression processing cycle of the decompressor 71b that performs decompression processing of the sub-block data elements 11B, an arrow Y3c indicates a decompression processing cycle of the decompressor 71c that performs decompression processing of the sub-block data elements 11C, and an arrow Y3d indicates a decompression processing cycle of the decompressor 71d that performs decompression processing of the sub-block data elements 11D.

Because the decompressors 71a to 71d can decompress the 16-bit compressed data respectively from the 0th cycle, any of the decompressors 71a to 71d can finish the decompression processing in 64 cycles corresponding to the sub-block data of 8 pixels×8 bits. After the decompression processing is started, a throughput of 1 pixel/cycle in the decompression processing can be ensured, because the transfer rate of 16 bits/cycle of the bus 50 is faster than one pixel (up to 15 bits) per cycle, which is bit consumption/throughput of the decompression processing.

Figure 9:
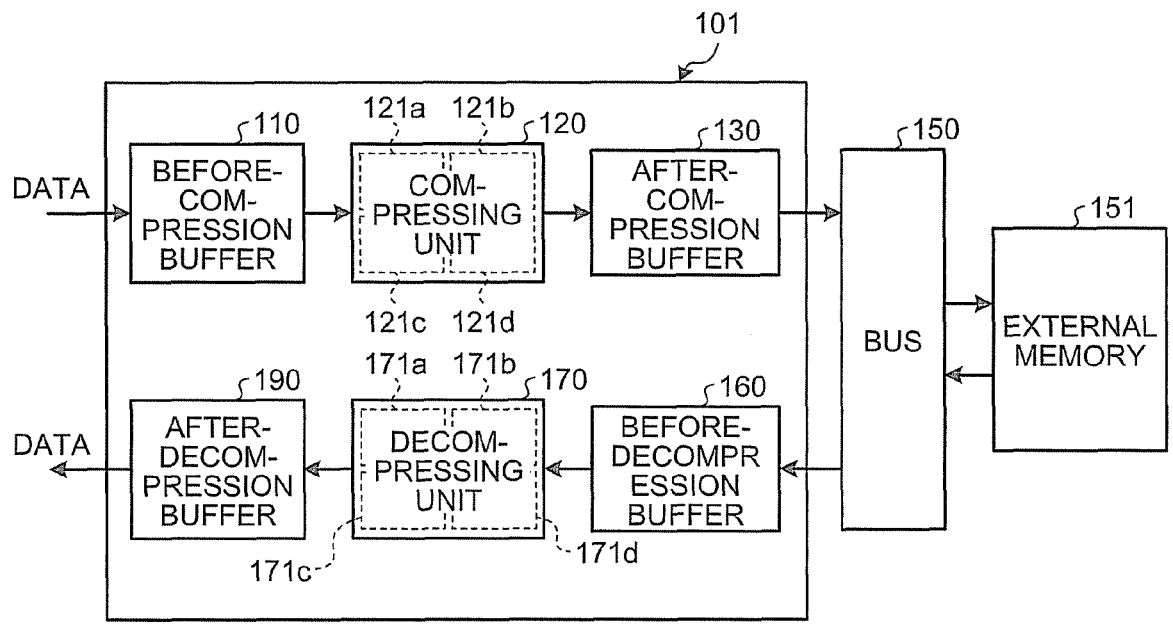
FIG. 9 is a block diagram of a configuration of a compression/decompression apparatus according to a conventional technique.

A conventional compression/decompression apparatus is explained. FIG. 9 is a block diagram of an outline of a conventional compression/decompression apparatus. As shown in FIG. 9, a conventional compression/decompression apparatus 101 includes a compressing unit 120 having a plurality of compressors 121a to 121d corresponding to respective sub-block data elements and a decompressing unit 170 having a plurality of decompressors 171a to 171d, in addition to a before-compression buffer 110, an after-compression buffer 130, a before-decompression buffer 160, and an after-decompression buffer 190, so that compression and decompression of the respective sub-block data elements are performed in parallel.

Figure 10:
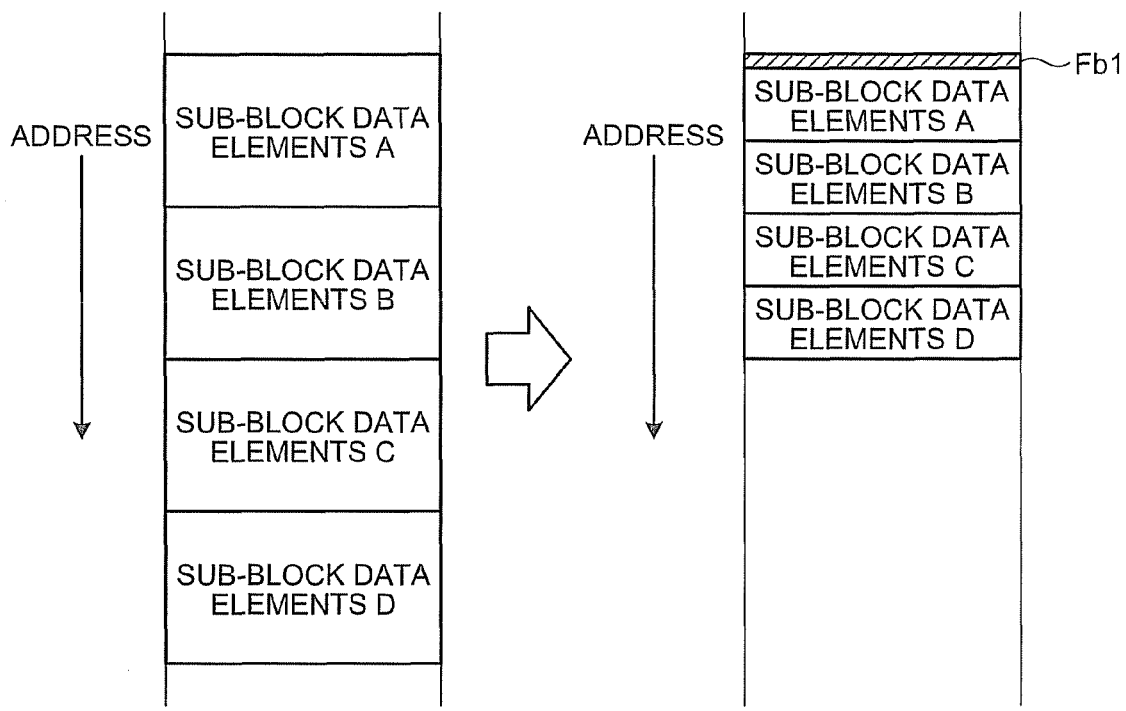
FIG. 10 is a schematic diagram for explaining transfer data generated by a data combining circuit shown in FIG. 9.

However, the conventional compression/decompression apparatus 101 compresses data before compression arranged in order of the sub-block data elements 11A to 11D as shown in (1) in FIG. 10 in this arrangement order as shown in (2) in FIG. 10. Conventionally, because the elements of compressed data are transferred directly in order of the sub-block data elements 11A to 11D, first transfer data Fb1 includes only the compressed data of the first sub-block data elements 11A. In the conventional compression/decompression apparatus 101, transfer of the sub-block data elements 11B is not performed until transfer of the sub-block data elements 11A to an external memory 151 is finished. Further, the conventional compression/decompression apparatus 101 sequentially reads the transfer data to be decompressed, which is read from the external memory 151 via a bus 150, in order of the sub-block data elements 11A to 11D.

That is, read of data of the sub-block data elements 11B is performed as shown by an arrow Y1b in FIG. 8, only in the fourth cycle in which all the sub-block data elements 11A have been read from the external memory 151 as shown by an arrow Y1a. Likewise, read of data of the sub-block data elements 11C is performed as shown by an arrow Y1c, only in the eighth cycle in which all the sub-block data elements 11B have been read from the external memory 151, and read of data of the sub-block data elements 11D is performed as shown by an arrow Y1d, only in the twelfth cycle in which all the sub-block data elements 11C have been read from the external memory 151. Conventionally, therefore, the decompressor 171a corresponding to the sub-block data elements 11A performs the decompression processing of the sub-block data elements 11A from the 0th cycle as shown by an arrow Y2a in FIG. 8, because the transfer data read first includes the compressed data of the sub-block data elements 11A. That is, the decompressor 171a starts the decompression processing of the sub-block data elements 11A from the 0th cycle and finishes the processing in the 64th cycle. On the other hand, because the elements of compressed data of the sub-block data elements 11B to 11D are not included in the transfer data read first, the decompressors 171b to 171d corresponding to the sub-block data elements 11B to 11D cannot acquire the compressed data to be decompressed in the 0th cycle, and thus cannot perform the decompression processing from the 0th cycle. Specifically, the decompressor 171b waits until the fourth cycle as shown by an arrow Y2b, starts the decompression processing of the sub-block data elements 11B from the fourth cycle in which the transfer data including the compressed data of the sub-block data elements 11B can be read, and finishes the decompression processing of all of the sub-block data elements 11B in the 68th cycle. The decompressor 171c waits until the eighth cycle as shown by an arrow Y2c, starts the decompression processing of the sub-block data elements 11C from the eighth cycle in which the transfer data including the compressed data of the sub-block data elements 11C can be read, and finishes the decompression processing of all of the sub-block data elements 11C in the 72nd cycle. Further, the decompressor 171d waits until the twelfth cycle as shown by an arrow Y2d, starts the decompression processing of the sub-block data elements 11D from the twelfth cycle in which the transfer data including the compressed data of the sub-block data elements 11D can be read, and finishes the decompression processing of all of the sub-block data elements 11D in the 76th cycle.

Conventionally, therefore, a processing time for 76-cycles is required due to the waiting of the respective decompressors 171b to 171d for up to 12 cycles, in addition to 64-bit cycle of 8 bits×8 pixels required for the decompression processing itself, until the block data 11G including the sub-block data elements 11A to 11D is decompressed. In this way, conventionally, even if the decompressors are provided in the same number as the number of the sub-block data elements, there is a case that some of the decompressors cannot start processing and have to wait until transfer of at least the sub-block data elements 11C is finished, and thus high level parallelism cannot be maintained. Accordingly, a large number of cycles are required for the decompression processing of the entire block data.

On the other hand, in the compression/decompression apparatus 1 according to the first embodiment, the data combining circuit 40 evenly divides the transfer data amount per cycle into the number equal to the number of the sub-block data elements 11A to 11D so that the compressed data of the sub-block data elements 11A to 11D to be decompressed is respectively input to all the decompressors 71a to 71d from a first decompression timing. After allocating the same amount of compressed data of the sub-block data elements 11A to 11D respectively compressed by the compressors 21a to 21d to the respective segmented regions, the data combining circuit 40 combines the data elements in the respective segmented regions to generate transfer data, and outputs the transfer data to the external memory 51. As a result, the 64-bit transfer data read by the compression/decompression apparatus 1 from the external memory 51 includes 16-bit compressed data of the sub-block data elements 11A to 11D, respectively. Therefore, the decompressors 71a to 71d can start the decompression processing in parallel without waiting from the 0th cycle in which the first transfer data has reached the compression/decompression apparatus 1, and any of the decompressors 71a to 71d can finish the decompression processing in 64 cycles of 8 pixels×8 bits. Accordingly, as shown in FIG. 8, the compression/decompression apparatus 1 can finish the decompression processing earlier than in the conventional apparatus by 12 cycles.

In the first embodiment, the transfer data amount per cycle is divided, and after allocating the compressed sub-block data elements 11A to 11D respectively to the segmented regions, the data elements in the respective segmented regions are combined to generate transfer data, so that the compressed data to be decompressed is input to all the decompressors from the first decompression timing. Accordingly, high level parallelism of the compression/decompression processing can be maintained and the number of cycles to be required for the decompression processing of the entire block data can be reduced.

Figure 11:
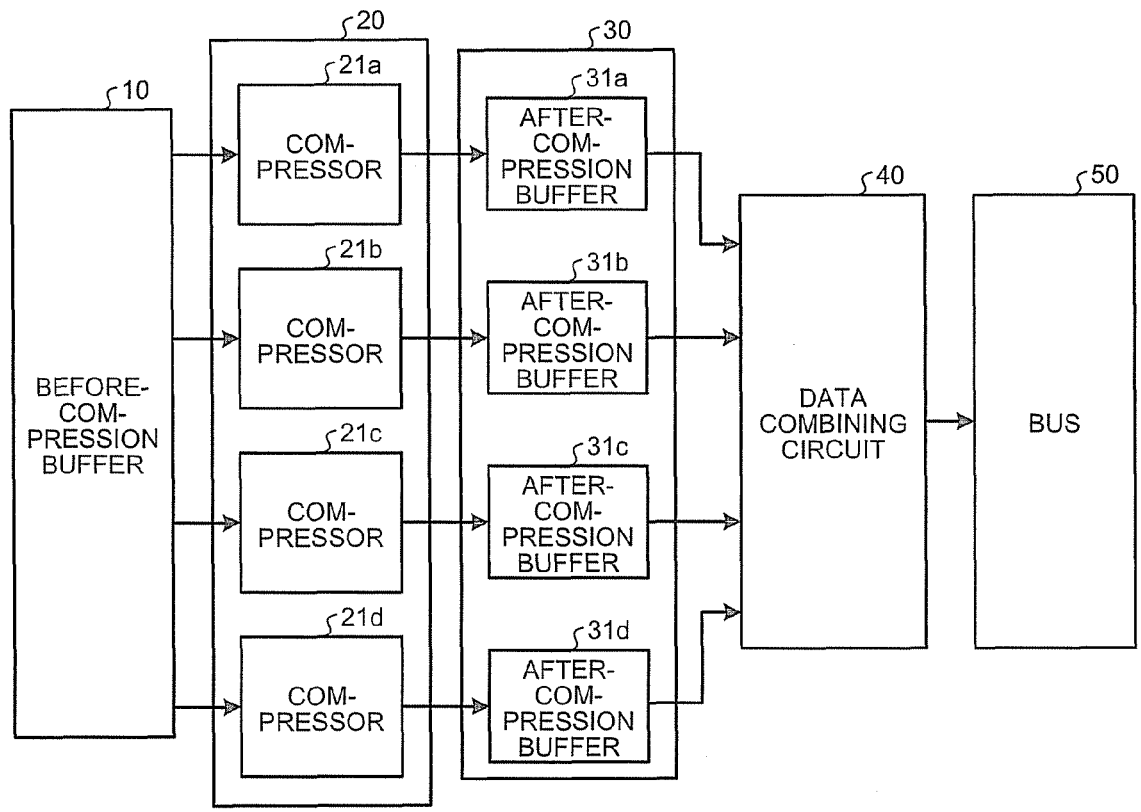
FIG. 11 is a block diagram of relevant parts on a compression side of the compression/decompression apparatus shown in FIG. 1.

Relevant parts on a compression side of the compression/decompression apparatus 1 shown in FIG. 1 are explained in detail. FIG. 11 is a block diagram of relevant parts on the compression side of the compression/decompression apparatus 1. As shown in FIG. 11, the after-compression buffer 30 includes a plurality of after-compression buffers 31a to 31d respectively corresponding to the compressors 21a to 21d, to temporarily store data compressed by the corresponding compressors 21a to 21d.

First, the entire sub-block data elements of the pixel data to be compressed are stored in the before-compression buffer 10. The four compressors 21a to 21d respectively read data of the corresponding sub-block data elements 11A to 11D from the before-compression buffer 10 and compress the four sub-block data elements 11A to 11D in parallel. For example, in the first compression processing, the compressor 21a reads data in the pixel 0, the compressor 21b reads data in the pixel 64, the compressor 21c reads data in the pixel 128, and the compressor 21d reads data in the pixel 192.

The respective data elements compressed by the respective compressors 21a to 21d are then stored in the after-compression buffers 31a to 31d respectively corresponding to the compressors 21a to 21d. Because a compression throughput is one pixel per cycle, a transfer throughput of 8 bits per cycle from the before-compression buffer 10 is only required for each of the compressors 21a to 21d. Because a pixel after compression has up to 15 bits, 15 bits per cycle needs to be transferred from the compressors 21a to 21d to the respective after-compression buffers 31a to 31d.

Figure 12:
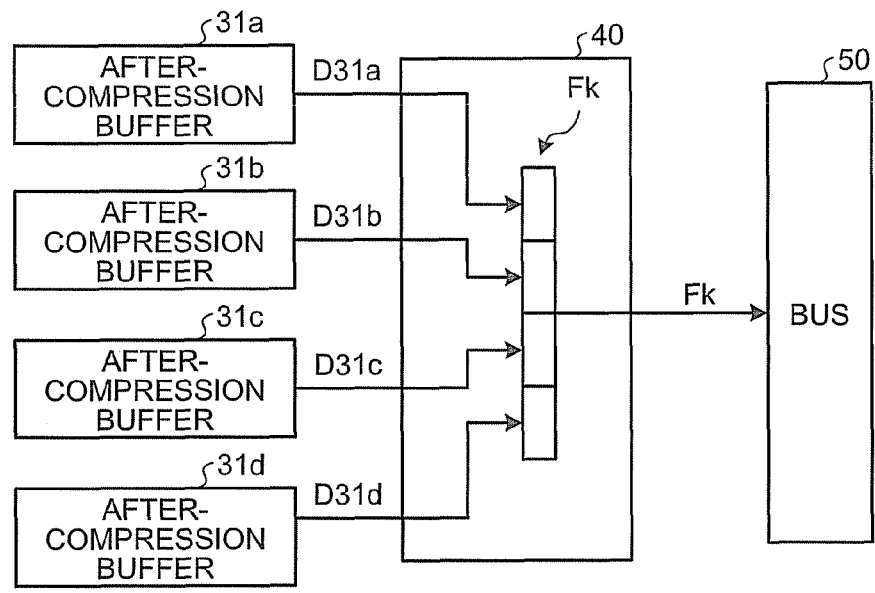
FIG. 12 is a schematic diagram of a configuration of the data combining circuit shown in FIG. 1.

The data combining circuit 40 then generates transfer data in which respective elements of compressed data of the sub-block data elements 11A to 11D read from the after-compression buffers 31a to 31d are allocated to the respective segmented regions by 16 bits at a time and writes out the transfer data to the bus. Because burst transfer through the bus is performed by 64 bits per cycle, a transfer throughput of 16 bits per cycle, which is acquired by dividing 64 bits by 4, is required for the four after-compression buffers 31a to 31d. Because supply of data from the compressors 21a to 21d to the after-compression buffers 31a to 31d is minimum 1 bit per cycle, transfer to the bus 50 is started after a sufficient amount of compressed data or compressed data for the entire sub-block data elements is accumulated in the after-compression buffers 31a to 31d. As shown in FIG. 12, the data combining circuit 40 synthesizes the 16-bit data elements D31a to D31d respectively output from the after-compression buffers 31a to 31d to acquire 64-bit transfer data Fk and outputs the transfer data Fk to the bus 50.

Figure 13:
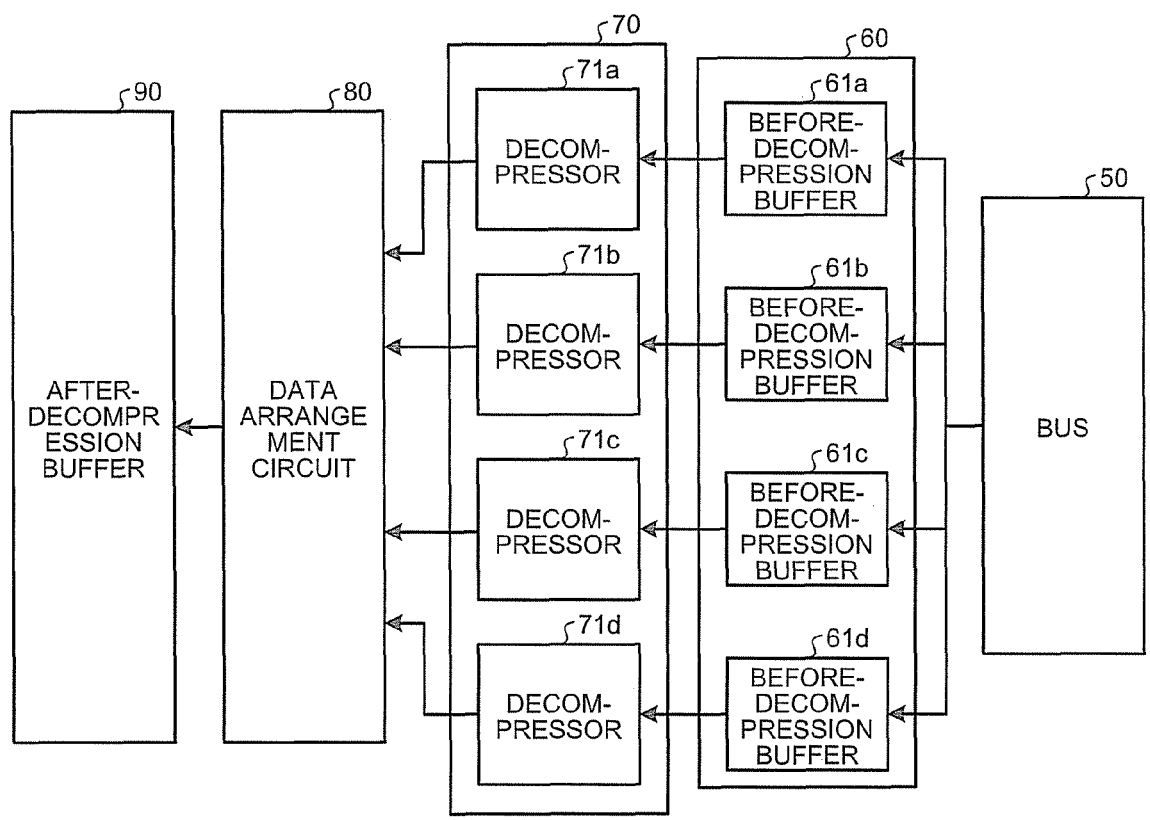
FIG. 13 is a block diagram of relevant parts on a decompression side of the compression/decompression apparatus shown in FIG. 1.

A mechanism on a decompression side of the compression/decompression apparatus 1 is explained next in detail. FIG. 13 is a block diagram of relevant parts on the decompression side of the compression/decompression apparatus 1. As shown in FIG. 13, the before-decompression buffer 60 includes a plurality of before-decompression buffers 61a to 61d respectively corresponding to the decompressors 71a to 71d, and temporarily stores data to be decompressed by the corresponding decompressors 71a to 71d, which is read from the external memory 51 via the bus 50.

Among the transfer data of 64 bits per cycle, which is transferred from the bus 50, 0 to 15 bits are stored in the before-decompression buffer 61a, 16 to 31 bits are stored in the before-decompression buffer 61b, 32 to 47 bits are stored in the before-decompression buffer 61c, and 48 to 63 bits are stored in the before-decompression buffer 61d. Because the respective decompressors 71a to 71d can extract up to 16-bit data per cycle for each decompressor, the decompressors 71a to 71d repetitively perform such decompression processing that after 16-bit compressed data is extracted from the corresponding before-decompression buffers 61a to 61d and decompressed, the decompressors 71a to 71d extract 16-bit compressed data to be decompressed next from the respective before-decompression buffers 61a to 61d. The data arrangement circuit 80 then performs address conversion with respect to the respective pixel data decompressed by the decompressors 71a to 71d so that the respective elements of pixel data are arranged at an original position in the block data 11G before compression, and writes the pixel data in the after-decompression buffer 90. Therefore, the pixel data held in the after-decompression buffer 90 is arranged in pixel arrangement before compression. Because one pixel has a size of 8 bits after decompression, from the respective decompressors 71a to 71d to the data arrangement circuit 80, a transfer throughput of 8 bits per cycle is only required for each of the decompressors 71a to 71d. Further, from the data arrangement circuit 80 to the after-decompression buffer 90, a transfer throughput of 32 bits corresponding to four pixels per cycle is sufficient.

Figure 14:
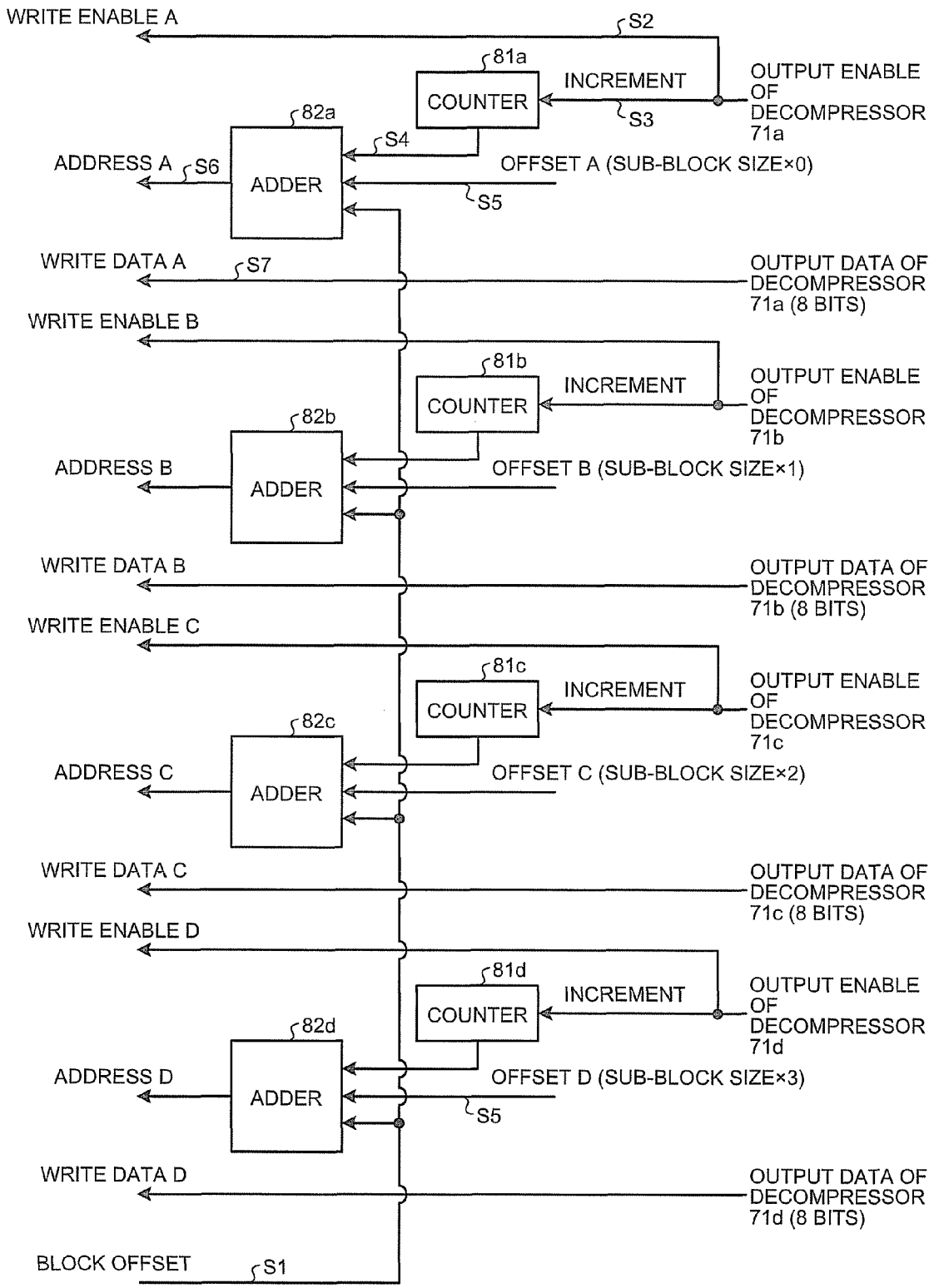
FIG. 14 is a schematic diagram of a configuration of a data arrangement circuit shown in FIG. 1.

As shown in FIG. 14, the data arrangement circuit 80 includes counters 81a to 81d and adders 82a to 82d respectively corresponding to the respective sub-block data elements 11A to 11D. Address conversion performed by the data arrangement circuit 80 is explained, for example, for the decompressed data output from the decompressor 71a as an example.

An output enable signal S71a from the decompressor 71a is input first, and write data A, which is pixel data decompressed by the decompressor 71a and constitutes the sub-block data elements 11A, is input from the decompressor 71a. The output enable signal becomes a write enable signal S2 corresponding to the write data A, and is input to the counter

81a as a signal S3 to increment the counter 81a, and an incremented counter value is input to the adder 82a as a signal S4. When a block offset S1, which is an offset value indicating at which position the target block data is held in the after-decompression buffer 90, is input, the adder 82a adds the signal S4 from the counter 81a and an offset signal S5 corresponding to the write data A. The adder 82a then outputs an address signal S6 of the write data A to the after-decompression buffer 90, synchronized with the write enable signal S2 and a signal S7 corresponding to the write data A. For example, with respect to the decompressed data input first, the data arrangement circuit 80 allocates an address of the pixel 0 to the data input from the decompressor 71a, allocates an address of a pixel 64 to the data input from the decompressor 71b, allocates an address of the pixel 128 to the data input from the decompressor 71c, and allocates an address of the pixel 192 to the data input from the decompressor 71d.

As described above, because the data arrangement circuit 80 allocates an address indicating the original position in the block data 11G of the pixel data actually decompressed to the write enable signal and the pixel data and outputs these to the after-decompression buffer 90, the respective sub-block data elements decompressed by the decompressors 71a to 71d can be arranged to be the original block data.

In the first embodiment, an example of the compression/decompression apparatus 1 including four compressors 21a to 21d as the compressor is explained. However, the number of compressors is not necessarily four, which is the same number as the number of the sub-block data elements 11A to 11D, and can be one to three. In this case, the accumulation speed of data after compression becomes slow; however, there is no particular influence on the operation of the compression/decompression apparatus.

Figure 15:
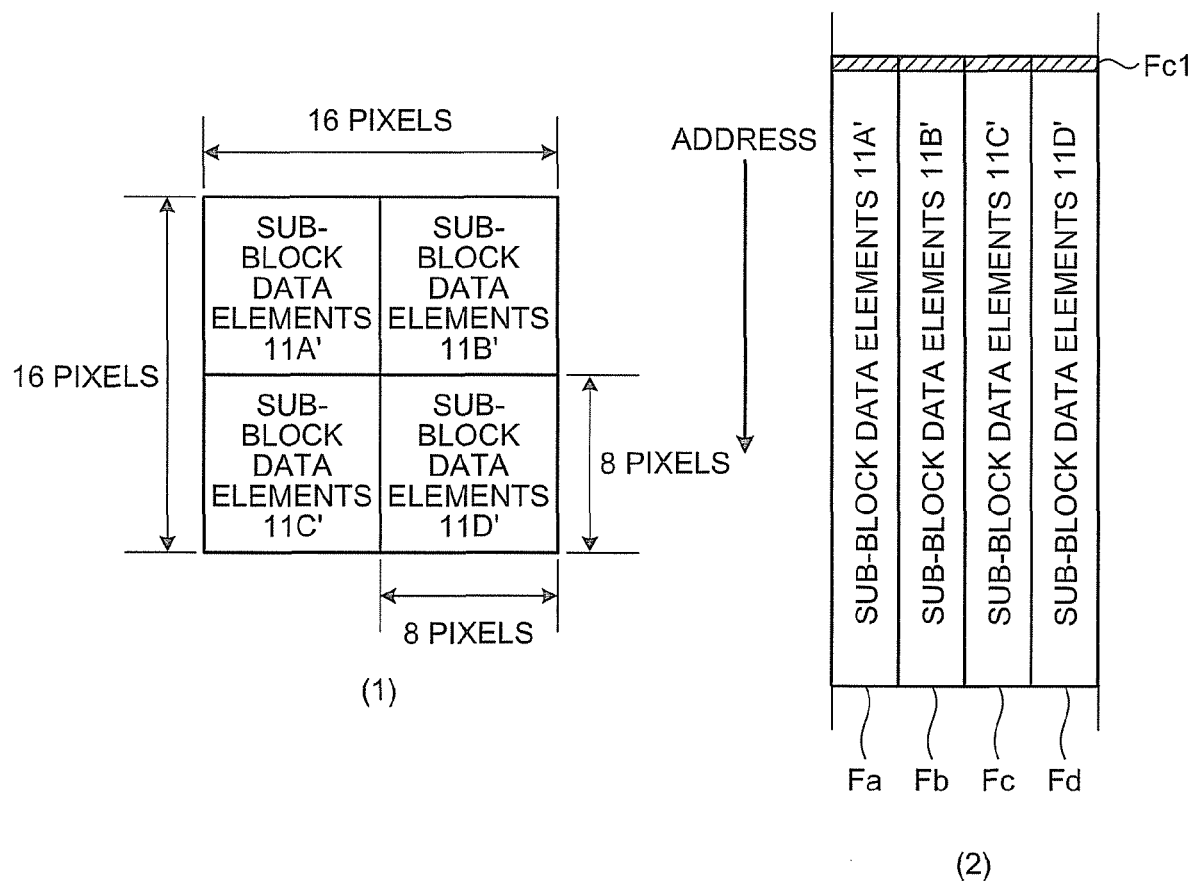
FIG. 15 is a schematic diagram for explaining another example of the dividing method of image data before compression.

Further, in the first embodiment, as shown in FIG. 2, an example in which the block data is divided into sub-block data elements 11A to 11D of 16×4 pixels is explained. However, the present invention is not limited thereto, and for example, as shown in (1) in FIG. 15, the present invention is applicable to a case that the block data is divided into sub-block data elements 11A' to 11D' of 8×8 pixels. In this case, as shown in (2) in FIG. 15, the data combining circuit 40 arranges data so that the respective sub-block data elements 11A' to 11D' compressed by the compressors 21a to 21d are allocated to the 16-bit segmented regions by 16 bits at a time, and all sub-block data elements 11A' to 11D' are included in the first transfer data Fc1. In this case, read address of the before-compression buffer and a processing content of the data arrangement circuit 80 at the time of supply of data from the before-compression buffer 10 to the compressors 21a to 21d change to correspond to the sub-block data elements 11A' to 11D'. Specifically, in the first compression processing, the compressor 21a reads data of the pixel 0, the compressor 21b reads data of a pixel 8, the compressor 21c reads data of the pixel 128, and the compressor 21d reads data of a pixel 136. The data arrangement circuit 80 then allocates the address of the pixel 0 to the data input from the decompressor 71a, allocates the address of the pixel 8 to the data input from the decompressor 71b, allocates the address of the pixel 128 to the data input from the decompressor 71c, and allocates the address of the pixel 136 to the data input from the decompressor 71d, with respect to the decompressed data input first.

A second embodiment of the present invention is explained next. In the second embodiment, the number of divisions of the transfer data amount per cycle is set based on the data amount including a header and the first pixel data in the first sub-block data elements after compression, so that all compressed elements of the first pixel data are included in the first transfer data and the decompression processing can be started from the 0th cycle.

Figure 16:
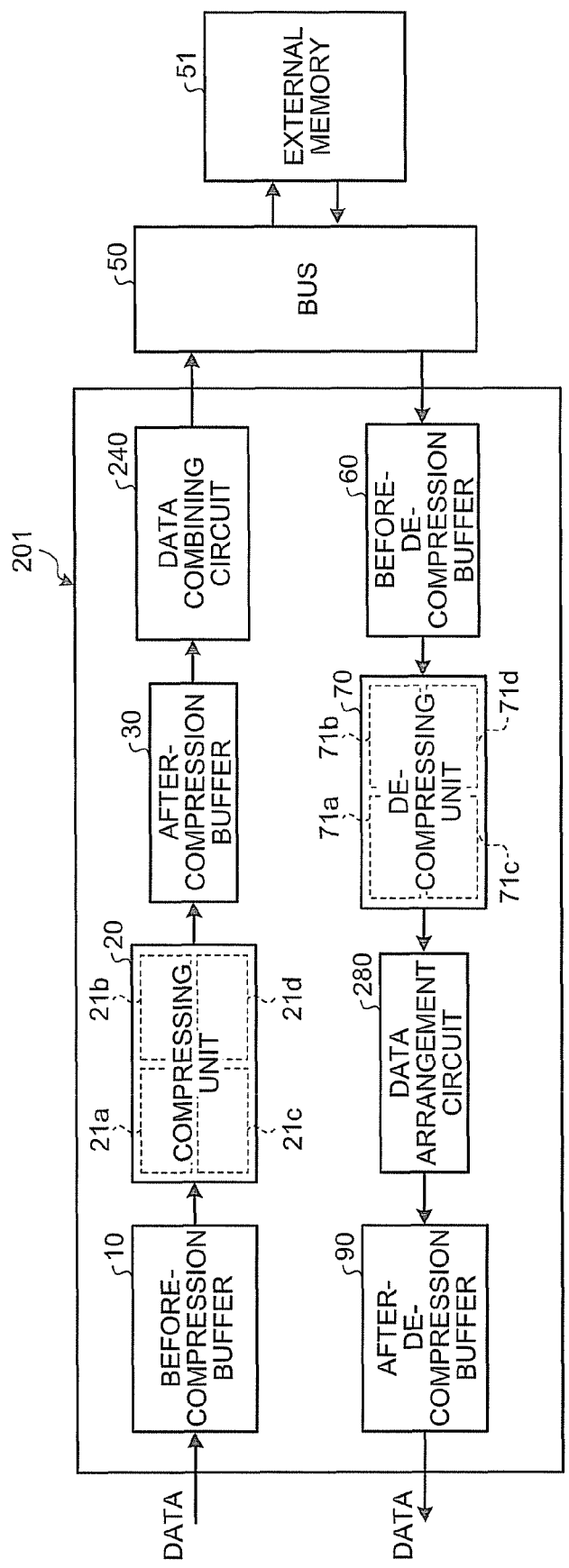
FIG. 16 is a block diagram of a configuration of a compression/decompression apparatus according to a second embodiment of the present invention.

FIG. 16 is a block diagram of a configuration of the compression/decompression apparatus according to the second embodiment. As shown in FIG. 16, a compression/decompression apparatus 201 according to the second embodiment includes a data combining circuit 240 instead of the data combining circuit 40 shown in FIG. 1 and a data arrangement circuit 280 instead of the data arrangement circuit 80 shown in FIG. 1.

In the compression/decompression apparatus 201, the number of divisions of the transfer data amount per cycle is set corresponding to the data amount including the header and the first data in the first sub-block data elements after compression. When the set number of divisions of the transfer data amount per cycle is less than the number of sub-block data elements, the data combining circuit 240 allocates the sub-block data unallocated to the previous transfer data to the next transfer data, and repeats allocation of the respective sub-block data elements in this order of allocation. The data arrangement circuit 280 performs address conversion so that the pixel data that corrects respective sub-block data elements respectively decompressed by the decompressors 71a to 71d is arranged at the original position in the block data 11G before compression, matched with allocation processing of the compressed data performed by the data combining circuit 240.

Figure 17:
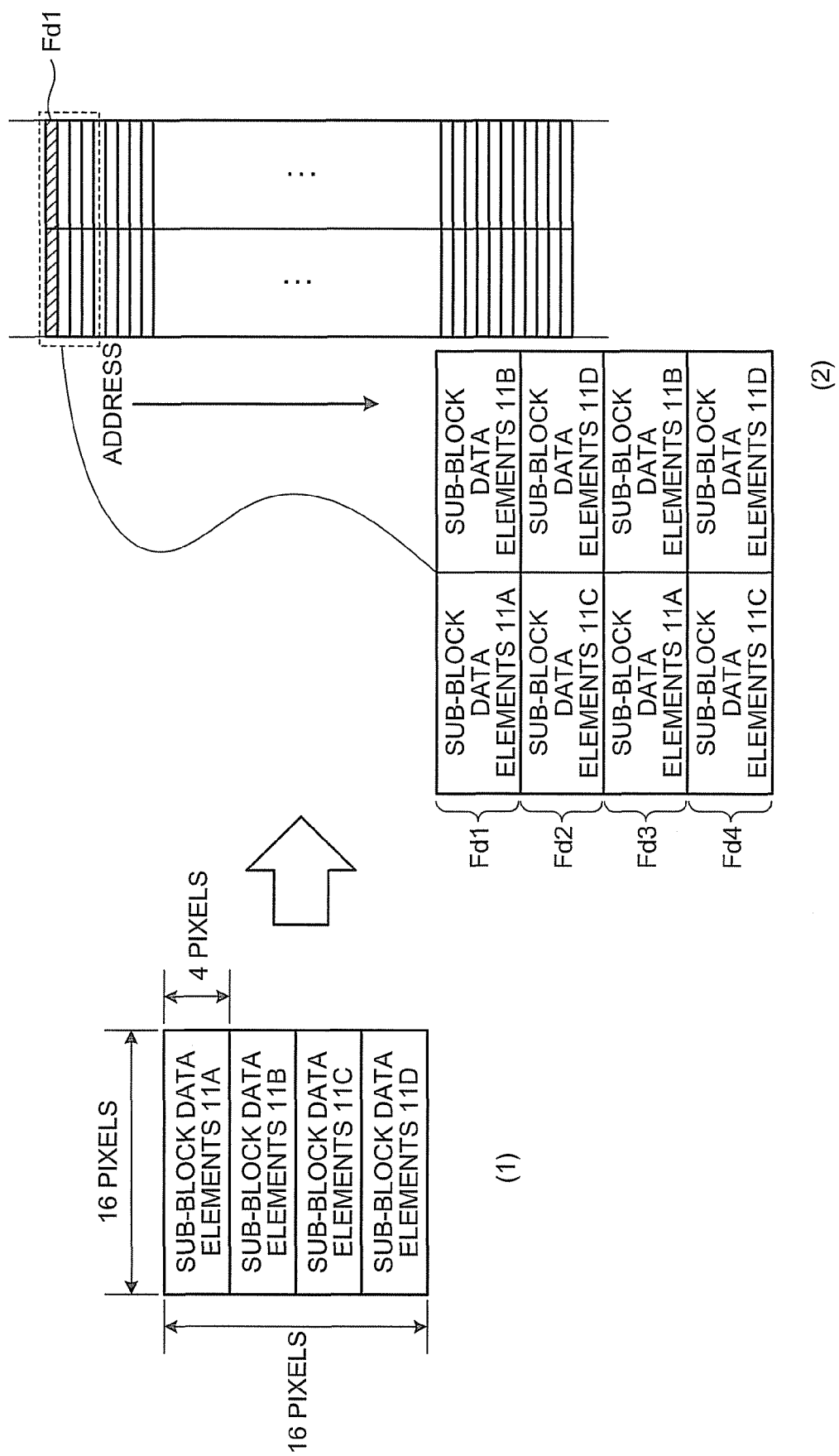
FIG. 17 is a schematic diagram for explaining transfer data generated by a data combining circuit shown in FIG. 16.

Specifically, with respect to the four sub-block data elements 11A to 11D divided into a size of 16×4 pixels as shown in (1) in FIG. 17, the data combining circuit 240 allocates the data of the two sub-block data elements to one transfer data in order as shown in (2) in FIG. 17. In this case, the data combining circuit 240 divides 64 bits, which is the transfer data amount per cycle, by two and allocates 32 bits each to the respective segmented regions. That is, as shown in FIG. 18, 32 bits are allocated to each sub-block data in one transfer data.

Figure 18:
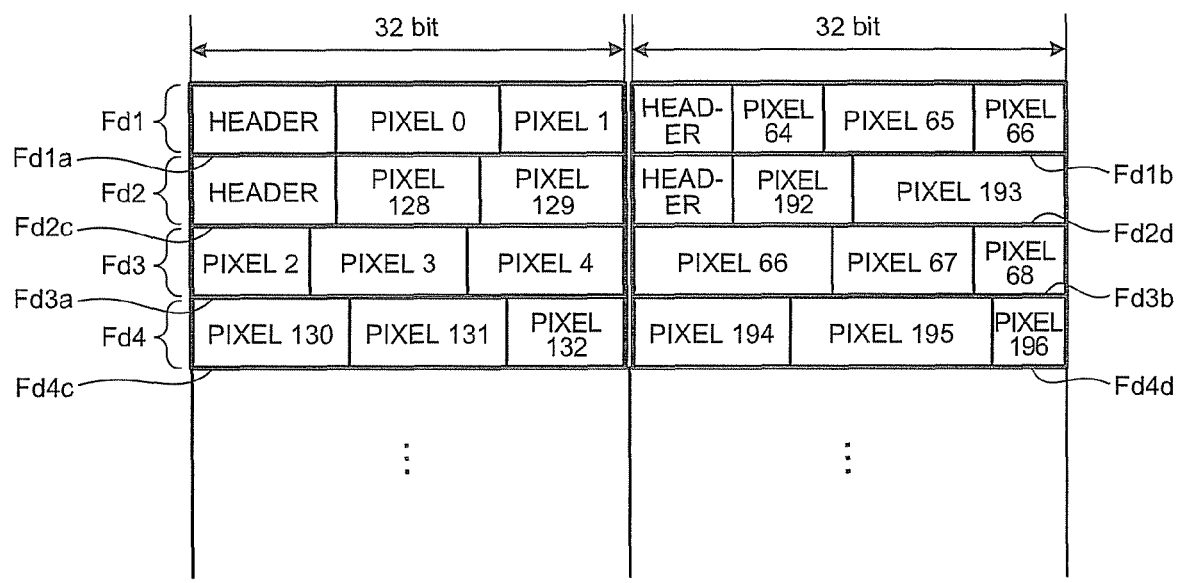
FIG. 18 is a schematic diagram for explaining transfer data shown in FIG. 17.

As shown in (2) in FIG. 17 and FIG. 18, the data combining circuit 240 allocates the header, compressed data of the pixel 0, and compressed data of the pixel 1 of the sub-block data elements 11A among the sub-block data elements 11A to 11D to the segmented region Fd1*a* of the first transfer data Fd1, and allocates the header, compressed data of the pixel 64, compressed data of a pixel 65, and compressed data of a pixel 66 of the sub-block data elements 11B among the sub-block data elements 11A to 11D to the segmented region Fd1*b* of the transfer data Fd1. The data combining circuit 240 then allocates the header and pixel data of the sub-block data elements 11C and 11D, which are not allocated to the first transfer data Fd1, to the two segmented regions Fd2*c* and Fd2*d* of the second transfer data Fd2. Further, the data combining circuit 240 allocates data of the sub-block data elements 11A and 11B to the two segmented regions Fd3*a* and Fd3*b* of the third transfer data Fd3 as in the first transfer data Fd1, and allocates data of the sub-block data elements 11C and 11D to the two segmented regions Fd4*c* and Fd4*d* of the fourth transfer data Fd4 as in the second transfer data Fd2. The data combining circuit 240 repeats allocation of respective compressed data of the sub-block data elements to the respective segmented regions in this allocation order. Accordingly, the compressed data of one element of sub-block data elements is included in every other transfer data.

Figure 19:
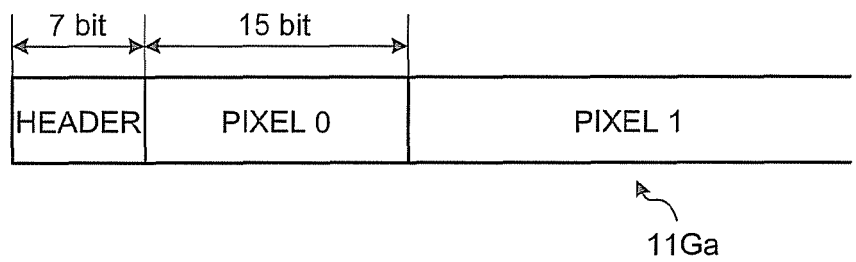
FIG. 19 is a schematic diagram for explaining image data after compression.

In the first embodiment, 16 bits are allocated to one element of sub-block data elements in one transfer data. In this case, because 16 bits are allocated to one element of sub-block data elements, as shown in the data 11Ga after compression in FIG. 19, when the sum total of the header and the compressed data of the first pixel 0 is 17 bits or more, all the data elements of the first pixel 0 cannot be allocated to the first transfer data. As a result, even when the first transfer data is read from the external memory 51 for the decompression processing, the decompression processing cannot be started from the 0th cycle, and the decompression processing has to wait until the first cycle in which the next transfer data is read.

Figure 20:
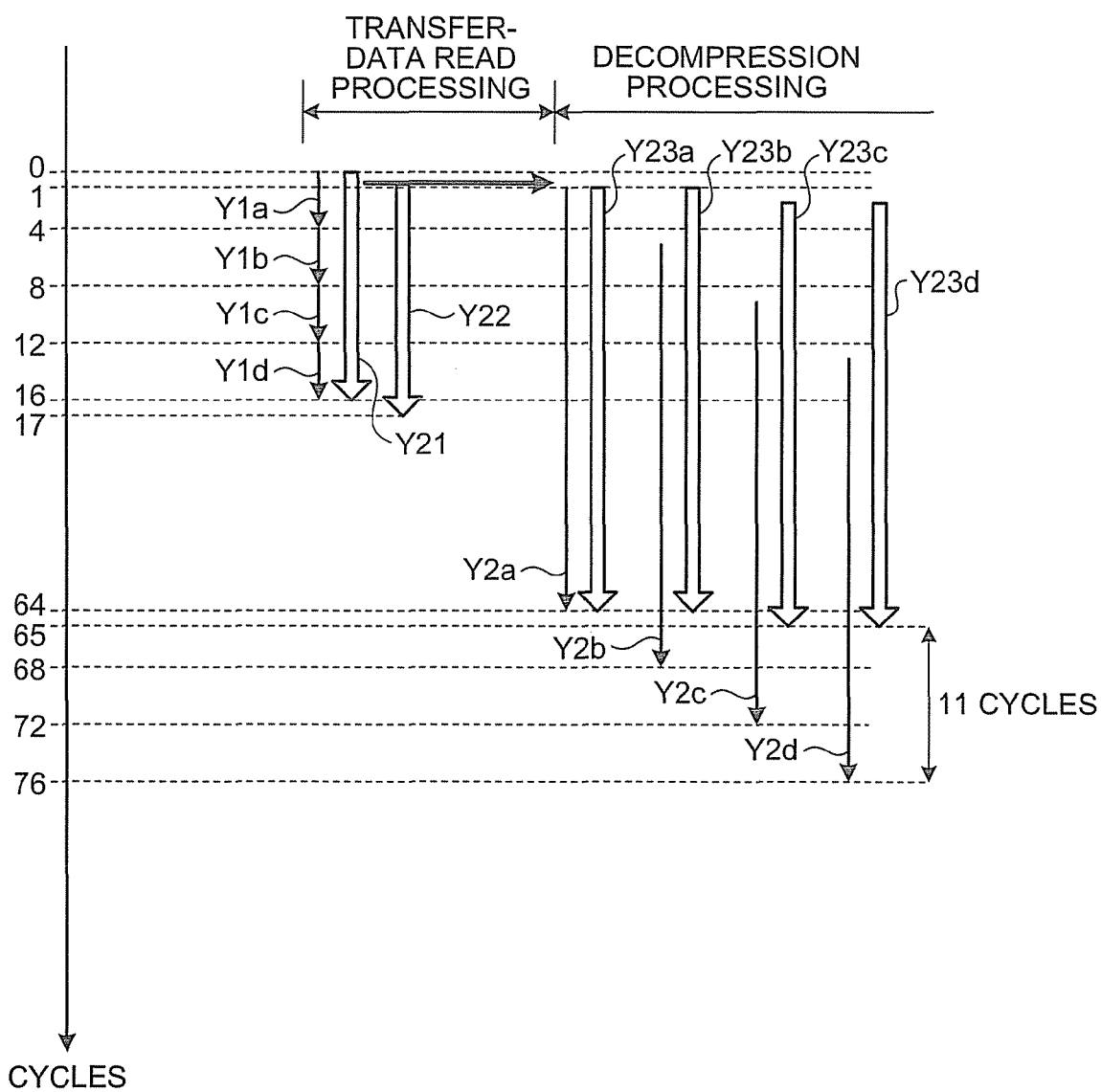
FIG. 20 is a schematic diagram for explaining cycles required for decompression processing in the second embodiment.

On the other hand, in the second embodiment, as shown in FIG. 18, the number of divisions of the transfer data amount per cycle is set to two corresponding to the data amount including the header and the first data in the first sub-block data elements after compression and 32 bits are allocated to one element of sub-block data elements, so that the compressed data of the first pixel of the sub-block data elements 11A is reliably included in the transfer data read first from the external memory 51. In the second embodiment, therefore, even when the sum total of the header and the first compressed data is 17 bits or more, all the elements of compressed data of the first pixel 0 can be allocated to the first transfer data. Accordingly, the compressed data of the first pixel of the sub-block data elements 11A and the compressed data of the first pixel of the sub-block data elements 11B are reliably included in the transfer data read first from the external memory 51 in a cycle period shown by an arrow Y21 in FIG. 20. Accordingly, the decompressors 71*a* and 71*b* can start the decompression processing from the 0th cycle, as shown by arrows Y23*a* and Y23*b*, with respect to the sub-block data elements 11A and 11B. As shown by an arrow Y22 in FIG. 20, because the compressed data of the first pixel of the sub-block data elements 11C and the compressed data of the first pixel of the sub-block data elements 11D are reliably included in the transfer data, which is transferred next and arrives in the 1st cycle, the decompressors 71*c* and 71*d* can start the decompression processing from the 1st cycle in which the transfer data has arrived, as shown by arrows Y23*a* and Y23*b*, with respect to the sub-block data elements 11C and 11D.

Further, when all the elements of compressed data of the pixel 1 to be decompressed next are included in 32 bits allocated to the first transfer data, the decompressors 71*a* and 71*b* can directly perform the decompression processing with respect to the pixel 1, without waiting after performing the decompression processing with respect to the pixel 0. Therefore, as shown by arrows Y23*a* and Y23*b* in FIG. 20, the decompressors 71*a* and 71*b* can complete the decompression processing with respect to the sub-block data elements 11A and 11B in the 64th cycle. Further, as shown by arrows Y23*c* and Y23*d* in FIG. 20, the decompressors 71*c* and 71*d* can complete the decompression processing with respect to the sub-block data elements 11C and 11D in the 65th cycle.

As described above, in the second embodiment, even when the data amount including the header and the compressed data of first pixel is 17 bits or more, all the compressed data elements of the first pixel 0 can be allocated to the first transfer data. Because the compressed data to be decompressed first can be decompressed from the 0th cycle, there is no need of waiting for reading the data to be compressed. In the second embodiment, as shown by arrows Y23*a* to Y23*d* in FIG. 20, because the decompressed processing of all the sub-block data elements 11A to 11D can be finished in 65 cycles, the decompression processing can be finished 11 cycles faster than in the conventional technique in which the decompression processing of the all the sub-block data elements 11A to 11D finishes in 76 cycles as shown by arrows Y2*a* to Y2*d* in FIG. 20. Therefore, also in the second embodiment, high level parallelism of the compression/decompression processing can be maintained and the number of cycles required for the decompression processing of the entire block data can be reduced.

A third embodiment of the present invention is explained next. In the third embodiment, the number of divisions of the transfer data amount per cycle is set to the number equal to or less than the number of sub-block data elements, based on the data amount including the header and the first pixel data in the first sub-block data elements after compression, thereby enabling to finish the decompression processing with the least cycle.

Figure 21:
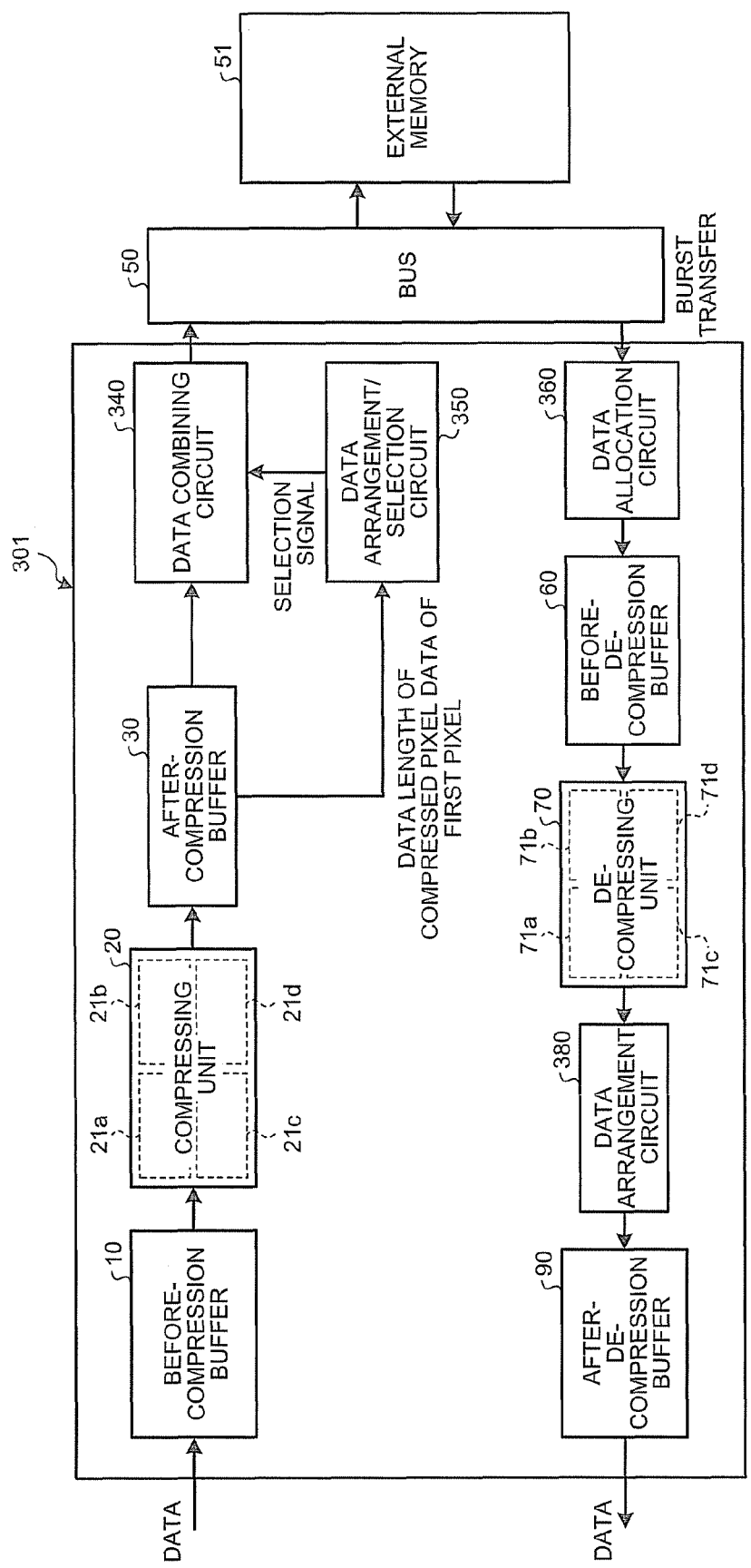
FIG. 21 is a block diagram of a configuration of a compression/decompression apparatus according to a third embodiment of the present invention.

FIG. 21 is a block diagram of a configuration of the compression/decompression apparatus according to the third embodiment. A compression/depression apparatus 301 according to the third embodiment includes a data combining circuit 340 instead of the data combining circuit 40 shown in FIG. 1 and a data arrangement circuit 380 instead of the data arrangement circuit 80 shown in FIG. 1. The compression/depression apparatus 301 further includes a data arrangement/selection circuit 350 and a data allocation circuit 360, which is different from the compression/depression apparatus 1 shown in FIG. 1.

The data arrangement/selection circuit 350 selects the number equal to or less than the number of sub-block data elements as the number of divisions of 64-bit transfer data amount per cycle, based on the data amount including the header and the first data in the first sub-block data elements after compression. Because the after-compression buffer 30 transmits information indicating a data length of the compressed pixel data of the first pixel in the respective sub-block data elements, the data arrangement/selection circuit 350 selects the number of divisions of the transfer data amount per cycle based on the information.

Specifically, when the data amount including the header and the compressed data of the first pixel 0 in the first sub-block data elements 11A after compression is 16 bits or less, the data arrangement/selection circuit 350 selects four as the number of divisions of the 64-bit transfer data amount per cycle, which is equal to the number of sub-block data elements 11A to 11D. In this case, because the data amount including the header and the compressed data of the first pixel 0 in the first sub-block data elements 11A after compression is 16 bits or less, even if 64 bits, which is the transfer data amount per cycle, is divided into four, the header and all of the compressed data elements of the pixel 0 of the sub-block data elements 11A can be included in the first transfer data. On the other hand, when the data amount including the header and the compressed data of the first pixel 0 in the first sub-block data elements 11A after compression is more than 16 bits, the data arrangement/selection circuit 350 sets the number of divisions of the 64-bit transfer data amount per cycle to two, which is less than the number of sub-block data elements 11A to 11D. In this case, if the transfer data amount per cycle is divided into four, the header and all of the compressed data elements of the pixel 0 in the sub-block data elements 11A cannot be included in the first transfer data. Therefore, the header and all elements of compressed data of the pixel 0 in the sub-block data elements 11A are reliably included in the first transfer data by dividing 64 bits into two and allocating 32 bits to one segmented region.

Figures 22, 23:
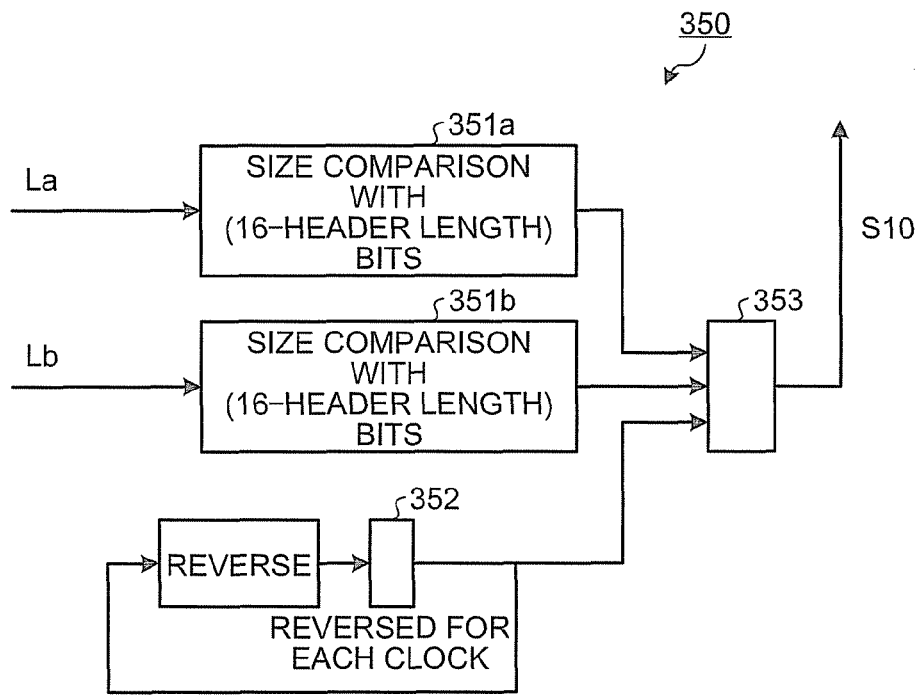
FIG. 22 is a schematic diagram of a configuration of a data arrangement/selection circuit shown in FIG. 21.
FIG. 23 is a table for explaining a selection signal shown in FIG. 22.

As shown in FIG. 22, the data arrangement/selection circuit 350 includes comparison circuits 351*a* and 351*b*, a register 352 which is reversed for each clock, and a combining circuit 353. As shown in FIG. 22, the after-compression buffer 30 inputs information La indicating a compressed data length of the first pixel in the sub-block data elements 11A and information Lb indicating a compressed data length of the first pixel in the sub-block data elements 11B. The comparison circuit 351a compares the size between the compressed data length of the first pixel in the sub-block data elements 11A and a value obtained by subtracting a header length (7 bits) from 16 bits based on the input information La, and outputs a comparison result. Likewise, the comparison circuit 351b compares the size between the compressed data length of the first pixel in the sub-block data elements 11B and a value obtained by subtracting the header length from 16 bits based on the input information Lb, and outputs a comparison result.

The combining circuit 353 then outputs a selection signal S10 based on the comparison results output from the comparison circuits 351a and 351b. When the sum total of the header and the first compressed pixel data is 16 bits or less in both of the sub-block data elements 11A and 11B, the combining circuit 353 generates a selection signal S10a for selecting four as the number of divisions of 64-bit transfer data amount per cycle. The selection signal S10a indicates compressed data of the respective sub-block data elements 11A to 11D as output data to the bus in any cycle, as shown in a table T1 in FIG. 23. On the other hand, if the sum total of the header and the first compressed pixel data is larger than 16 bits in either sub-block data elements 11A or 11B, the combining circuit 353 generates a selection signal S10b for selecting two as the number of divisions of 64-bit transfer data amount per cycle. When the combining circuit 353 selects two as the number of divisions of 64-bit transfer data amount per cycle, because data arrangement is different for each clock, the combining circuit 353 generates the selection signal S10b of data arrangement combined with a value of the register 352 which is reversed for each clock. The selection signal S10b indicates either the compressed data of the sub-block data elements 11A and 11B or the compressed data of the sub-block data elements 11C and 11D as output data to the bus in any cycle, as shown in the table T1 in FIG. 23. The data arrangement/selection circuit 350 outputs the generated selection signal S10 to the data combining circuit 340. The selection signal S10 is used at the time of performing data combination processing with respect to the compressed transfer data.

The data combining circuit 340 divides the transfer data amount per cycle according to the number of divisions selected by the data arrangement/selection circuit 350, and allocate the compressed data of a plurality of sub-block data elements to each segmented region, and generates transfer data attached with division information indicating the number of divisions of the transfer data amount per cycle.

Figure 24:
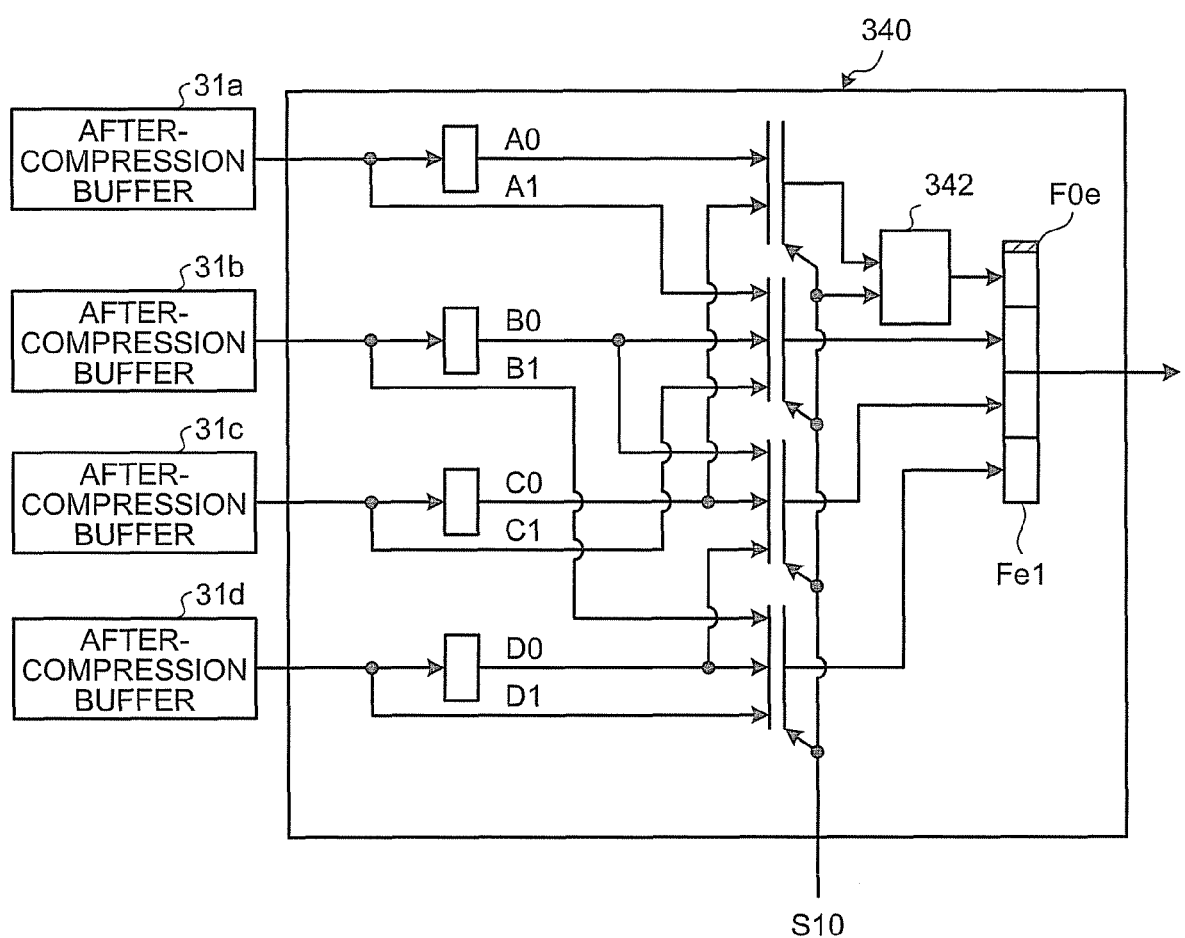
FIG. 24 is a schematic diagram of a configuration of a data combining circuit shown in FIG. 21.

As shown in FIG. 24, elements of compressed data of the sub-block data elements 11A to 11D compressed by the respective after-compression buffers 31a to 31d are output by 16 bits at a time. For example, the first 16-bit compressed data A0 including the header and the compressed data of the first pixel 0 and the next 16-bit compressed data A1 are output from the after-compression buffer 31a. The data combining circuit 340 divides the 64-bit transfer data amount per cycle into four or two, according to the number of divisions indicated by the selection signal S10 input from the data arrangement/selection circuit 350.

When the selection signal S10a is input from the data arrangement/selection circuit 350, the data combining circuit 340 divides the 64-bit transfer data amount per cycle into four, as shown in the table T1 in FIG. 23, and allocates compressed data of the sub-block data elements 11A to 11D to each segmented region by 16 bits each. Further, a first-bit replacing unit 342 generates division information indicating that the number of divisions of the transfer data amount per cycle is four, corresponding to the input selection signal S10a. When transfer data Fe1 to be transferred first is generated, the data combining circuit 340 combines data elements in the respective segmented regions allocated with the header and the compressed data of the first pixel of the respective sub-block data elements and incorporates the division information in the first bit F0e of the header of the first sub-block data elements 11A, to thereby generate the first transfer data Fe1.

When the selection signal S10b is input from the data arrangement/selection circuit 350, the data combining circuit 340 divides the 64-bit transfer data amount per cycle into two, as shown in the table T1 in FIG. 23, and after allocating the compressed data of the sub-block data elements 11A and 11B to the segmented regions by 32 bits each, combines the elements of data of two segmented regions to generate the first transfer data. The data combining circuit 340 generates the transfer data in which the compressed data of the sub-block data elements 11C and 11D are allocated by 32 bits each as the next transfer data. By repeating this, the transfer data is generated so that the compressed data of the sub-block data elements 11A to 11D are included by 32 bits each alternately. Further, the first-bit replacing unit 342 generates division information indicating that the number of divisions of the transfer data amount per cycle is two, corresponding to the input selection signal S10b, and generates the first transfer data Fe1 by incorporating the division information in the first bit F0e of the header of the first sub-block data elements 11A.

The data allocation circuit 360 divides the transfer data read from the external memory 51 according to the number of divisions of the transfer data amount per cycle and allocates the divided transfer data to each of the decompressors 71a to 71d. The data allocation circuit 360 divides the transfer data read from the external memory 51 based on the division information attached to the transfer data by the data combining circuit 340.

Figures 25, 26:
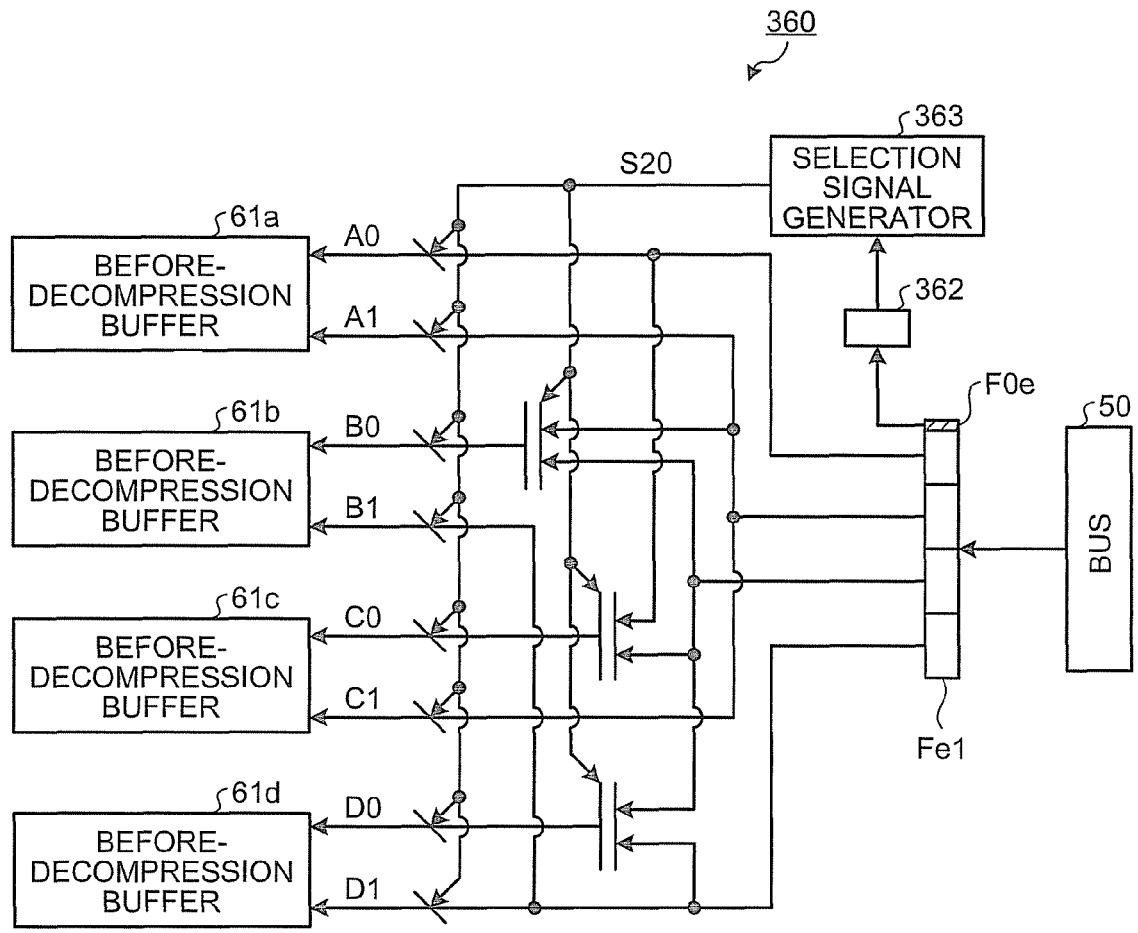
FIG. 25 is a schematic diagram of a configuration of a data allocation circuit shown in FIG. 21.
FIG. 26 is a table for explaining a selection signal shown in FIG. 25.

The data allocation circuit 360 includes, as shown in FIG. 25, a separation circuit 362 that separates and acquires the first bit F0e of the transfer data Fe1 read first from the external memory 51, and a selection signal generator 363 that generates a selection signal S20 indicating the number of divisions in the transfer data to be read, by referring to the division information incorporated in the acquired first bit. The data allocation circuit 360 divides the transfer data according to the selection signal S20 generated by the selection signal generator 363 and allocates the divided transfer data to before-decompression buffers 61a to 61b.

When the division information indicates that the number of divisions of the transfer data amount per cycle is four, the selection signal generator 363 generates a selection signal S20a for selecting four as the number of divisions of the 64-bit transfer data amount. The selection signal S20a indicates, as shown in a table T2 in FIG. 26, that the transfer data is divided into four, and each transfer data includes compressed data of each of the sub-block data elements 11A to 11D as the output data from the bus for each cycle. The data allocation circuit 360 divides the 64-bit transfer data amount into four according to the selection signal S20a, and allocates the compressed data of the respective sub-block data elements 11A to 11D included in the respective segmented regions to the before-decompression buffers 61a to 61d by 16 bits each.

Further, when the division information indicates that the number of divisions of the transfer data amount per cycle is two, the selection signal generator 363 generates a selection signal S20b for selecting two as the number of divisions of the 64-bit transfer data amount. The selection signal S20b indicates, as shown in the table T2 in FIG. 26, that the transfer data is divided into two, and each transfer data includes compressed data of the respective sub-block data elements 11A to 11D by 32 bits each alternately, as the output data from the bus 50. The data allocation circuit 360 divides the first transfer data into two and allocates the compressed data of the sub-block data elements 11A and 11B included in the respective segmented regions to the before-decompression buffers 61a and 61b by 32 bits each. The data allocation circuit 360 then divides the next transfer data into two and allocates the compressed data of the sub-block data elements 11C and 11D included in the respective segmented regions to the before-decompression buffers 61c and 61d by 32 bits each. By repeating this, the data allocation circuit 360 allocates data to the before-decompression buffers 61a and 61b or to the before-decompression buffers 61c and 61d alternately. Further, the data arrangement circuit 380 performs address conversion according to the allocation content of the compressed data to the respective before-decompression buffers 61a to 61d by the data allocation circuit 360.

As described above, in the third embodiment, the decompression processing is finished with the least cycle by selecting the number equal to or less than the number of sub-block data elements as the number of divisions of transfer data amount per cycle, based on the data amount including the header and the first pixel data in the first sub-block data elements after compression. Accordingly, the number of cycles required for the decompression processing of the entire block data is reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A compression/decompression apparatus that compresses or decompresses a plurality of sub-block data elements acquired by dividing block data for data communication with an external memory, the compression/decompression apparatus comprising:
    a compressing unit that includes a plurality of compressors in same number as a number of the sub-block data elements and is configured to compress the plurality of sub-block data elements in parallel by using the plurality of compressors;
    a combining unit configured to combine compressed data compressed by the plurality of compressors to generate transfer data such that the transfer data has a transfer data amount corresponding to a plurality of transferring cycles, wherein each transfer data amount per one transferring cycle is divided into a plurality of segmented regions in same number as a number of the sub-block data elements, and each compressed data of the plurality of sub-block data elements is allocated to a corresponding segmented region of the plurality of segmented regions, wherein the combining component is further configured to output the transfer data to the external memory;
    a decompressing unit that includes a plurality of decompressors in the same number as the number of the sub-block data elements and is configured to decompress compressed data of the transfer data read from the external memory and allocated to respective segmented regions in parallel by using the plurality of decompressors; and
    an arranging unit configured to perform address conversion so that respective elements of the data decompressed by the decompressing unit are arranged at original positions in the block data.

2. The compression/decompression apparatus according to claim 1, wherein the combining unit is further configured to evenly divide the transfer data amount per one transferring cycle into the number equal to the number of the sub-block data elements, and to respectively allocate a same amount of compressed data of the sub-block data elements compressed by the compressing unit to each segmented region.

3. A compression/decompression apparatus that compresses or decompresses a plurality of sub-block data elements acquired by dividing block data for data communication with an external memory, the compression/decompression apparatus comprising:
    a compressing unit that includes a plurality of compressors in same number as a number of the sub-block data elements and is configured to compress the plurality of sub-block data elements in parallel by using the plurality of compressors;
    a combining unit configured to combine compressed data compressed by the plurality of compressors to generate a transfer data such that the transfer data has a transfer data amount corresponding to a plurality of transferring cycles, wherein each transfer data amount per one transferring cycle is divided into at least two segmented regions, and each compressed data of at least two sub-block data elements among the plurality of the sub-block data elements is allocated to a corresponding segmented region of the at least two segmented regions, and wherein the combining unit is further configured to output the transfer data to the external memory;
    a decompressing unit that includes a plurality of decompressors in the same number as the number of sub-block data elements and is configured to decompress compressed data of the transfer data read from the external memory and allocated to respective segmented regions in parallel by using the plurality of decompressors to yield decompressed data; and
    an arranging unit configured to perform address conversion so that respective elements of the decompressed data are arranged at original positions in the block data,
    wherein a number of divisions of the transfer data amount per one transferring cycle is set based on a data amount including a header and first data in the first sub-block data elements after compression, and
    wherein, if a set number of divisions of the transfer data amount per one transferring cycle is less than the number of the sub-block data elements, the combining unit allocates compressed data of the sub-block data elements, which has not been allocated to previous transfer data, to next transfer data, and repeats allocation of compressed data of respective sub-block data elements.

4. The compression/decompression apparatus according to claim 3, wherein the number of divisions of the transfer data amount per one transferring cycle is set to a number that allows allocation of the header and the first data in the first sub-block data elements after compression to first transfer data.

5. The compression/decompression apparatus according to claim 3, wherein if the data amount including the header and the first data in the first sub-block data elements after compression is larger than a data amount in each segmented region at a time of evenly dividing the transfer data amount per one transferring cycle into a number equal to the number of the sub-block data elements, the number of divisions of the transfer data amount per one transferring cycle is set to a number less than the number of the sub-block data elements.

6. A compression/decompression apparatus that compresses or decompresses a plurality of sub-block data elements acquired by dividing block data for data communication with an external memory, the compression/decompression apparatus comprising:
   a compression unit that includes a plurality of compressors in a same number as a number of the sub-block data elements and is configured to compress the plurality of sub-block data elements in parallel by using the plurality of compressors;
   a combining unit configured to combine compressed data compressed by the plurality of compressors to generate transfer data such that the transfer data has a transfer data amount corresponding to a plurality of transferring cycles, wherein each transfer data amount per one transferring cycle is divided into at least two segmented regions, and each compressed data of at least two sub-block data elements among the plurality of the sub-block data elements is allocated to a corresponding segmented region of the at least two segmented regions, and wherein the combining unit is further configured to output the transfer data to the external memory;
   a decompressing unit that includes a plurality of decompressors in the same number as the number of the sub-block data elements and is configured to decompress compressed data of the transfer data read from the external memory and allocated to respective segmented regions in parallel by using the plurality of decompressors;
   an arranging unit configured to perform address conversion so that respective elements of the data decompressed by the decompressing unit are arranged at original positions in the block data;
   a selection unit configured to select a number of divisions of the transfer data amount per one transferring cycle based on a data amount including a header and first data in the first sub-block data elements after compression; and
   an allocating unit configured to divide the transfer data read from the external memory according to the number of divisions selected by the selecting unit and to allocate the divided transfer data to each decompressor, wherein
   the combining unit is further configured to divide the transfer data amount per one transferring cycle according to the number of divisions selected by the selecting unit to allocate compressed data of the compressed sub-block data elements to each segmented region, and to generate transfer data attached with division information indicating the number of divisions, and
   the allocating unit is further configured to divide the transfer data read from the external memory based on division information attached to the transfer data by the combining unit.

7. The compression/decompression apparatus according to claim 6, wherein if the data amount including the header and the first data in the first sub-block data elements after compression is equal to or less than a data amount of each segmented region in a case wherein the transfer data amount per one transferring cycle is evenly divided into a number equal to the number of the sub-block data elements, the selecting unit selects the same number as the number of the sub-block data elements as the number of divisions of the transfer data amount per one transferring cycle, and if the data amount including the header and the first data in the first sub-block data elements after compression is larger than the data amount of each segmented region in a case wherein the transfer data amount per one transferring cycle is evenly divided into the number equal to the number of the sub-block data elements, the selecting unit selects a number less than the number of the sub-block data elements as the number of divisions of the transfer data amount per one transferring cycle.

8. The compression/decompression apparatus according to claim 6, wherein the selecting unit is further configured to select a number equal to or less than the number of the sub-block data elements as the number of divisions of the transfer data amount per one transferring cycle, based on the data amount including the header and the first data in the first sub-block data elements after compression.

9. The compression/decompression apparatus according to claim 6, wherein the selecting unit is further configured to select a number that allows allocation of the header and the first data in the sub-block data elements after compression to a first transfer data, as the number of divisions of the transfer data amount per one transferring cycle.

10. A compression/decompression method for compressing or decompressing a plurality of sub-block data element acquired by dividing block data for data communication with an external memory, the compression/decompression method comprising:
    compressing the plurality of sub-block data elements in parallel by compressors in same number as a number of the sub-block data elements;
    combining compressed data of the plurality of sub-block data elements to generate transfer data such that the transferring data has a transfer data amount corresponding to a plurality of transfer cycles, wherein each transfer data amount per one transferring cycle is divided into a plurality of segmented regions in same number as the number of the sub-block data elements, and each compressed data of the plurality of sub-block data elements is allocated to a corresponding segmented region of the plurality of segmented regions, and outputting the transfer data to the external memory;
    decompressing compressed data of the transfer data read from the external memory and allocated to respective segmented regions in parallel by decompressors in the same number as the number of the sub-block data elements; and
    performing address conversion so that respective elements of the decompressed data are arranged at original positions in the data block.

11. The compression/decompression method according to claim 10, wherein the combining includes evenly dividing the transfer data amount per one transferring cycle into a number equal to the number of the sub-block data elements, and further comprising allocating a same amount of compressed data of the sub-block data elements compressed at the compressing is to each segmented region of the plurality of segmented regions.

12. A compression/decompression method for compressing or decompressing a plurality of sub-block data elements acquired by dividing block data for data communication with an external memory, the compression/decompression method comprising:
    compressing the plurality of sub-block data elements in parallel by compressors in same number as a number of the sub-block data elements;
    combining compressed data of the plurality of sub-block data elements to generate transfer data such that the transfer data has a transfer data amount corresponding to a plurality of transferring cycles, wherein each transfer data amount per one transferring cycle is divided into at least two segmented regions, and each compressed data of the plurality of sub-block data elements is allocated to a corresponding segmented region of the at least two segmented regions, and outputting the transfer data to the external memory;

decompressing compressed data of the transfer data read from the external memory and allocated to respective segmented regions in parallel by decompressors in same number as the number of the sub-block data elements; and performing address conversion so that respective elements of the decompressed data are arranged at original positions in the block data;

wherein a number of divisions of the transfer data amount per one transferring cycle is set based on a data amount including a header and first data in the first sub-block data elements after compression, and wherein, at the combining, if a set number of divisions of the transfer data amount per one transferring cycle is less than the number of the sub-block data elements, compressed data of the sub-block data elements, which has not been allocated to previous transfer data, is allocated to next transfer data, and allocation of compressed data of respective sub-block data elements is repeated.

13. The compression/decompression method according to claim 12, wherein if the data amount including the header and the first data in the first sub-block data elements after compression is larger than a data amount in each segmented region of the at least two segmented regions at a time of evenly dividing the transfer data amount per one transferring cycle into number equal to the number of the sub-block data elements, the number of divisions of the transfer data amount per one transferring cycle is set to a number less than the number of the sub-block data elements.

14. The compression/decompression method according to claim 12, wherein the number of divisions of the transfer data amount per one transferring cycle is set to a number that facilitates allocation of the header and the first data in the first sub-block data elements after compression to first transfer data.

15. A compression/decompression method for compressing or decompressing a plurality of sub-block data elements acquired by dividing block data for data communication with an external memory, the compression/decompression method comprising:

compressing the plurality of sub-block data elements in parallel by compressors in same number as a number of the sub-block data elements;

combining compressed data of the plurality of sub-block data elements to generate a transfer data such that the transfer data has a transfer data amount corresponding to a plurality of transferring cycles, wherein each transfer data amount per one transferring cycle is divided into at least two segmented regions, and each compressed data of the plurality of sub-block data elements is allocated to a corresponding segmented regions of the at least two segmented regions, and outputting the transfer data to the external memory;

decompressing compressed data to the transfer data read from the external memory and allocated to respective segmented regions of the at least two segmented regions in parallel by decompressors in the same number as the number of the sub-block data elements;

performing address conversion so that respective elements of the decompressed data are arranged at original positions in the block data;

selecting a number of divisions of the transfer data amount per one transferring cycle based on a data amount including a header and first data in the first sub-block data elements after compression; and dividing the transfer data read from the external memory according to the number of divisions selected at the selecting and allocating the transfer data, after the dividing, to each decompressor, wherein at the combining, dividing the transfer data amount per one transferring cycle according to the number of divisions selected at the selecting to allocate compressed data of the compressed sub-block data elements to each segmented region, and generating transfer data attached with division information indicating the number of divisions, and at the allocating, dividing the transfer data read from the external memory based on division information attached to the transfer data at the combining.

16. The compression/decompression method according to claim 15, wherein the selecting includes, if the data amount including the header and the first data in the first sub-block data elements after compression is equal to or less than a data amount of each segmented region of the at least two segmented regions in a case wherein the transfer data amount per one transferring cycle is evenly divided into number equal to the number of the sub-block data elements, the same number as the number of the sub-block data elements is selected as the number of divisions of the transfer data amount per one transferring cycle, and if the data amount including the header and the first data in the first sub-block data elements after compression is larger than the data amount of each segmented region of the at least two segmented regions in a case wherein the transfer data amount per one transferring cycle is evenly divided into the number equal to the number of the sub-block data elements, a number less than the number of the sub-block data elements is selected as the number of divisions of the transfer data amount per one transferring cycle.

17. The compression/decompression method according to claim 15, wherein at the selecting, a number that facilitates allocation of the header and the first data in the first sub-block data elements after compression to first transfer data is selected as the number of divisions of the transfer data amount per one transferring cycle.

18. The compression/decompression method according to claim 15, wherein at the selecting, a number equal to or less than the number of the sub-block data elements is selected as the number of divisions of the transfer data amount per one transferring cycle, based on the data amount including the header and the first data in the first sub-block data elements after compression.

* * * * *